US012690280B2

(12) United States Patent
Emadi

(10) Patent No.: US 12,690,280 B2
(45) Date of Patent: Jul. 21, 2026

(54) SEMICONDUCTOR LIGHT RECEPTION

(71) Applicant: ILLUMINA, INC., San Diego, CA (US)

(72) Inventor: Arvin Emadi, San Jose, CA (US)

(73) Assignee: ILLUMINA, INC., San Diego, CA (US)

( * ) Notice: Subject to any disclaimer, the term of this patent is extended or adjusted under 35 U.S.C. 154(b) by 664 days.

(21) Appl. No.: 17/823,786

(22) Filed: Aug. 31, 2022

(65) Prior Publication Data

US 2023/0075101 A1 Mar. 9, 2023

Related U.S. Application Data

(60) Provisional application No. 63/239,874, filed on Sep. 1, 2021.

(51) Int. Cl.
H10F 39/10 (2025.01)
B01L 3/00 (2006.01)
(Continued)

(52) U.S. Cl.
CPC ...... H10F 39/107 (2025.01); B01L 3/502761 (2013.01); G01N 15/1404 (2013.01);
(Continued)

(58) Field of Classification Search
CPC .......... G01N 21/6454; G01N 21/6428; G01N 21/05; G01N 21/645; G01N 15/1404;
(Continued)

(56) References Cited

U.S. PATENT DOCUMENTS

2004/0125222 A1 7/2004 Bradski et al.
2007/0087382 A1 4/2007 Howorka et al.
(Continued)

FOREIGN PATENT DOCUMENTS

CN 111426666 A 7/2020
JP 2013092393 A 5/2013
(Continued)

OTHER PUBLICATIONS

Japan Patent Office, Search Report in corresponding JP Application 2024-506676, dated Mar. 25, 2026. 42 pages.

*Primary Examiner* — Marlon T Fletcher
*Assistant Examiner* — Kimberly Newman Frey
(74) *Attorney, Agent, or Firm* — Heslin Rothenberg Farley & Mesiti P.C.; George S. Blasiak, Esq.

(57) ABSTRACT

There is set forth herein a device comprising: a detector surface for supporting biological or chemical samples; an array of doped areas formed in a semiconductor formation, wherein the semiconductor formation receives excitation light and emission light from the detector surface, and wherein doped areas of the array of doped areas define photodiodes; a doped region formed in the semiconductor formation in a receive light path of the excitation light and emission light intermediate the detector surface and a doped area of the array of doped areas; and wherein the doped region is configured to impact a travel direction of electrons generated in the doped region as a result of photon absorption.

19 Claims, 14 Drawing Sheets

(51) Int. Cl.
    *G01N 15/1404*     (2024.01)
    *G01N 15/1434*     (2024.01)

(52) U.S. Cl.
    CPC ....... *G01N 15/1434* (2013.01); *H10F 39/103* (2025.01); *B01L 2200/0647* (2013.01); *B01L 2300/0645* (2013.01); *B01L 2300/0654* (2013.01)

(58) Field of Classification Search
    CPC .......... G01N 15/1434; G01N 15/1459; G01N 2021/0346; G01N 2021/6434; G01N 2021/648; G01N 2021/6441; G01N 2021/757; G01N 2021/7786
    See application file for complete search history.

(56)       References Cited

U.S. PATENT DOCUMENTS

| | | | |
|---|---|---|---|
| 2010/0204064 A1 | 8/2010 | Cho | |
| 2010/0247382 A1 | 9/2010 | Lee et al. | |
| 2012/0020229 A1 | 1/2012 | Dayal | |
| 2012/0156100 A1* | 6/2012 | Tsai | G01N 21/6454 |
| | | | 977/840 |
| 2012/0202299 A1* | 8/2012 | Lenoble | G01N 21/645 |
| | | | 422/69 |
| 2015/0104880 A1* | 4/2015 | Tagawa | G01N 33/5308 |
| | | | 250/226 |
| 2015/0184237 A1 | 7/2015 | Su et al. | |
| 2016/0041095 A1 | 2/2016 | Rothberg et al. | |
| 2017/0191125 A1 | 7/2017 | Vijayan et al. | |
| 2017/0275690 A1 | 9/2017 | Dehlinger et al. | |
| 2018/0180546 A1* | 6/2018 | Rothberg | H10F 39/151 |
| 2022/0381644 A1* | 12/2022 | Sternklar | G01L 1/24 |

FOREIGN PATENT DOCUMENTS

| | | |
|---|---|---|
| KR | 20100091839 A | 8/2010 |
| KR | 20190062241 A | 6/2019 |
| WO | WO2019132857 A1 | 7/2019 |
| WO | WO2020108588 A1 | 6/2020 |
| WO | WO2021071699 A1 | 4/2021 |
| WO | WO2021124340 A1 | 6/2021 |

* cited by examiner

WAVE LENGTH

SEMICONDUCTOR LIGHT RECEPTION

CROSS-REFERENCE TO RELATED APPLICATIONS

This application claims priority to U.S. Patent Application No. 63/239,874 filed Sep. 1, 2021, entitled "Semiconductor Light Reception" which is incorporated herein by reference in its entirety.

BACKGROUND

Various protocols in biological or chemical research involve performing controlled reactions. The designated reactions can then be observed or detected and subsequent analysis can help identify or reveal properties of chemicals involved in the reaction.

In some multiplex assays, an unknown analyte having an identifiable label (e.g., fluorescent label) can be exposed to thousands of known probes under controlled conditions. Each known probe can be deposited into a corresponding well of a microplate. Observing any chemical reactions that occur between the known probes and the unknown analyte within the wells can help identify or reveal properties of the analyte. Other examples of such protocols include known DNA sequencing processes, such as sequencing-by-synthesis (SBS) or cyclic-array sequencing.

In some fluorescent-detection protocols, an optical system is used to direct excitation light onto fluorophores, e.g., fluorescently-labeled analytes and to also detect the fluorescent emission light that can emit from the analytes having attached fluorophores. However, such optical systems can be relatively expensive and benefit from a larger benchtop footprint. For example, the optical system can include an arrangement of lenses, filters, and light sources.

In other proposed detection systems, the controlled reactions in a flow cell can be defined by a solid-state light sensor array (e.g., a complementary metal oxide semiconductor (CMOS) detector or a charge coupled device (CCD) detector). These systems do not involve a large optical assembly to detect the fluorescent emissions.

BRIEF DESCRIPTION

There is set forth herein, in one example, a device. The device can comprise, for example, a doped region formed in the semiconductor formation in a receive light path of excitation light and emission light.

There is set forth herein, in one example, a device. The device can comprise, for example, an array of doped areas formed in a semiconductor formation, wherein the semiconductor formation receives excitation light and emission light from the detector surface, and wherein doped areas of the array of doped areas define photodiodes; and a doped region formed in the semiconductor formation in a receive light path of excitation light and emission light.

There is set forth herein, in one example, a device. The device can comprise, for example, a detector surface comprising reaction sites for supporting biological or chemical samples; a plurality of spaced apart doped areas formed in a semiconductor formation, wherein the semiconductor formation receives excitation light and emission light from the detector surface, the plurality of spaced apart doped areas defining photodiodes; a plurality of spaced apart doped regions formed in the semiconductor formation, wherein respective ones of the plurality of spaced apart doped regions are associated to respective ones of the doped areas, and wherein the respective ones of the doped regions are disposed in a receive light path of the excitation light and emission light intermediate the detector surface and the respective ones of the doped areas; and wherein respective doped regions of the plurality of spaced apart doped regions formed in the semiconductor formation produce respective electric fields that impact a travel direction of electrons generated in the respective doped regions as a result of photons of the excitation light and emission light being absorbed in the respective doped regions.

There is set forth herein, in one example, a device. The device can comprise, for example, a detector surface for supporting biological or chemical samples; an array of doped areas formed in a semiconductor formation, wherein the semiconductor formation receives excitation light and emission light from the detector surface, and wherein doped areas of the array of doped areas define photodiodes; a doped region formed in the semiconductor formation in a receive light path of the excitation light and emission light intermediate the detector surface and a doped area of the array of doped areas; and wherein the doped region is configured to impact a travel direction of electrons generated in the doped region as a result of photon absorption.

There is set forth herein, in one example, a method. The method can comprise, for example, forming in a semiconductor formation an array of doped areas; forming in the semiconductor formation an array of doped regions, wherein respective doped regions of the array of doped regions are associated to respective doped areas of the array of doped areas; and forming a detector surface, wherein the semiconductor formation is configured to receive excitation light and emission light from the detector surface; wherein the respective doped regions are formed in the semiconductor formation in a receive light path of the excitation light and emission light from the detector surface.

There is set forth herein, in one example, a device. The device can comprise, for example, a support structure defining a detector surface configured for supporting biological or chemical samples; an array of doped areas formed in a semiconductor formation, wherein the semiconductor formation receives excitation light and emission light from the detector surface, and wherein doped areas of the array of doped areas define photodiodes; a doped region formed in the semiconductor formation in a receive light path of the excitation light and emission light intermediate the detector surface and a doped area of the array of doped areas; and wherein the doped region is configured to impact a travel direction of electrons generated in the doped region as a result of photon absorption.

DRAWINGS

These and other features, aspects, benefits, and advantages of the present subject matter will become better understood when the following detailed description is read with reference to the accompanying drawings in which like characters represent like parts throughout the drawings, wherein:

FIG. 1 is a schematic cutaway side view of a system for use in biological or chemical analysis having a detector that includes a detector surface for supporting a biological or chemical sample according to one example;

FIG. 2 spectral profile coordination diagram illustrating coordination between excitation wavelengths, absorption wavelengths, fluorescence emissions signal wavelengths, and detection band wavelengths according to one example;

DETAILED DESCRIPTION

Figure 1:
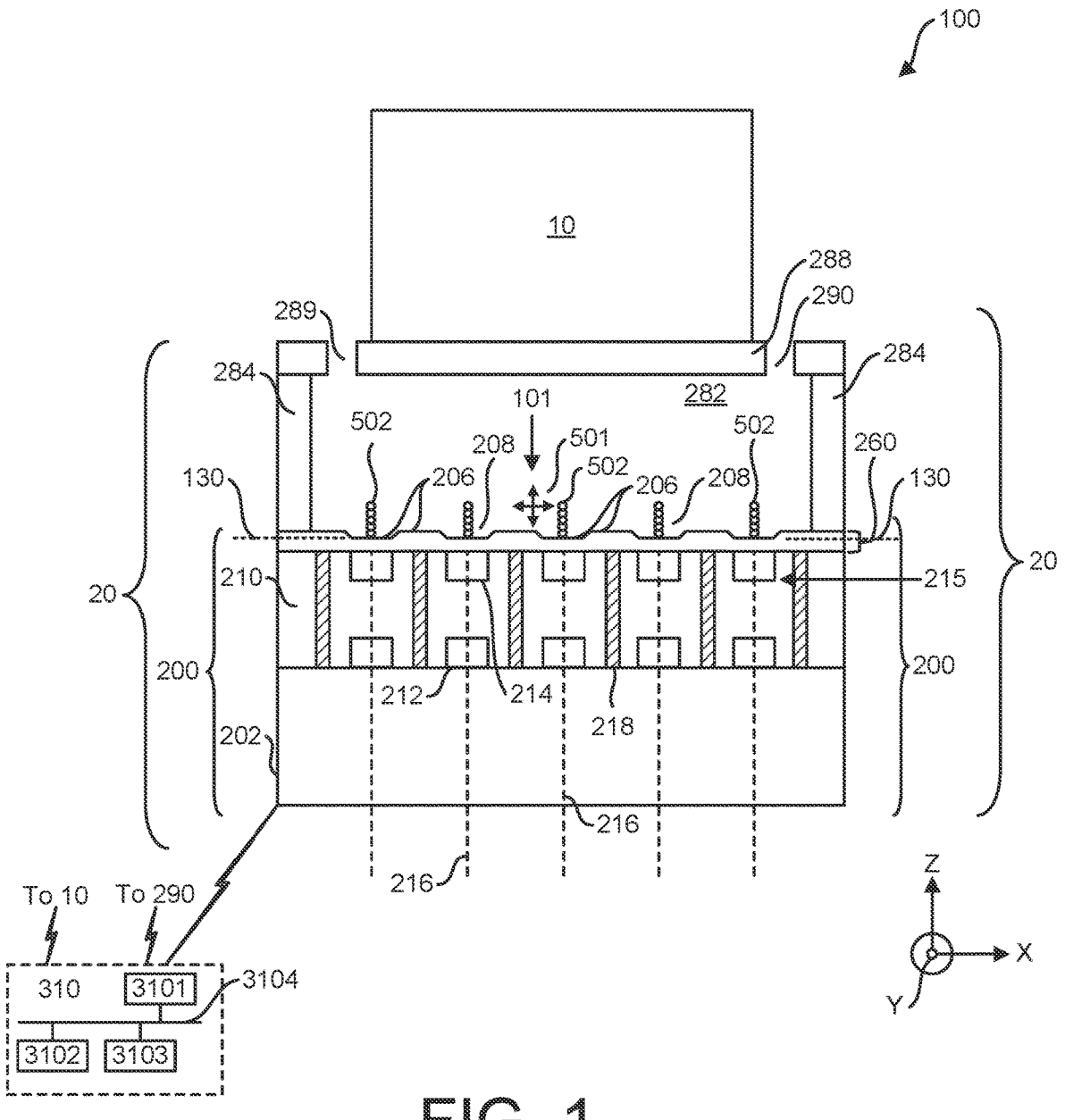

In FIG. 1 there is shown a system 100 for use in analysis, such as biological or chemical analysis. System 100 can include light energy exciter 10 and a detector assembly 20. Detector assembly 20 can include detector 200 and a flow cell 282 which flow cell 282 can be defined by detector 200. Detector 200 can include a plurality of doped areas 212 defining sensing photodiodes and detector surface 206 for supporting samples 502 such as biological or chemical samples subject to test. Sidewalls 284, and flow cover 288, as well as detector 200 having detector surface 206 can define and delimit flow cell 282. Detector surface 206 can have an associated detector surface plane 130.

In a further aspect, detector surface 206 can include reaction sites and in one example can be recessed to include reaction recesses 208 (nanowells). According to one example, each doped area 212 defining a sensing photodiode can be associated to and aligned to one reaction recess 208. Each reaction recess 208 can define therein one or more reaction sites and samples 502 can be supported on such reaction sites according to one example. Examples herein recognize that "area" as referred to herein in the context of "doped area" can refer to a volumetric space (in other words, not limited to a 2-dimensional space). As used herein, the term "reaction site" can refer to a localized region where at least one designated reaction may occur. As used herein, a "designated reaction" includes a change in at least one of a chemical, electrical, physical, or optical property (or quality) of a chemical or biological substance of interest, such as an analyte-of-interest.

In another aspect, detector 200 can include one or more metallization layer as set forth herein defining circuitry, e.g., for readout of signals from doped areas 212 defining sensing photodiodes, digitization, storage and signal processing.

According to one example, detector 200 can be provided by a solid-state integrated circuit detector, such as complementary metal oxide semiconductor (CMOS) integrated circuit detector or a charge coupled device (CCD) integrated circuit detector.

According to one example, system 100 can be used for performance of biological or chemical testing with use of fluorophores. For example, a fluid having one or more fluorophores can be caused to flow into and out of flow cell 282 through an inlet port using inlet port 289 and outlet port 290. Fluorophorescan attract to various samples 502 and thus, by their detection fluorophores can act as markers for the samples 502 e.g., biological or chemical analytes to which they attract.

To detect the presence of a fluorophore within flow cell 282, light energy exciter 10 can be energized so that excitation light 101 in an excitation wavelength range is emitted by light energy exciter 10. On receipt of excitation light 101 fluorophores attached to samples 502 radiate emission light 501, which is the signal of interest for detection by doped areas 212 defining sensing photodiodes. Emission light 501 owing to fluorescence of a fluorophore attached to a sample 502 will have a wavelength range red shifted relative to a wavelength range of excitation light 101.

Light energy exciter 10 can include at least one light source and at least one optical components to illuminate samples 502. Examples of light sources can include e.g., lasers, arc lamps, LEDs, or laser diodes. The optical components can be, for example, reflectors, dichroics, beam splitters, collimators, lenses, filters, wedges, prisms, mirrors, detectors, and the like. In examples that use an illumination system, the light energy exciter 10 can be configured to direct excitation light 101 to reaction sites. As one example, fluorophores can be excited by light in the green wavelength range, e.g., can be excited using excitation light 101 having a center (peak) wavelength of about 523 nm.

Examples herein recognize that a signal to noise ratio of system 100 can be expressed as set forth in the equation of (1) hereinbelow $$SNR = \frac{Signal}{\sqrt{\begin{array}{c} Signal + Excitation + AF + Background + \\ Dark\ Current + Read\ Noise^2 \end{array}}} \quad \text{(Eq. 1)}$$

where "Signal" is the emission light 501, i.e. the signal of interest light attributable to the fluorescence of a fluorophore attached to a sample, "Excitation" is unwanted excitation light reaching the doped areas 212 defining sensing photodiodes, "AF" is the autofluorescence noise radiation of one or more autofluorescence sources within detector 200, "Background" is unwanted light energy transmitted into detector 200 from a source external to detector 200, "Dark Current" is current flow noise associated to random electron-hole pair generation in the absence of light and "Read Noise" is noise associated to analog-to-digital electronics.

Figure 2:
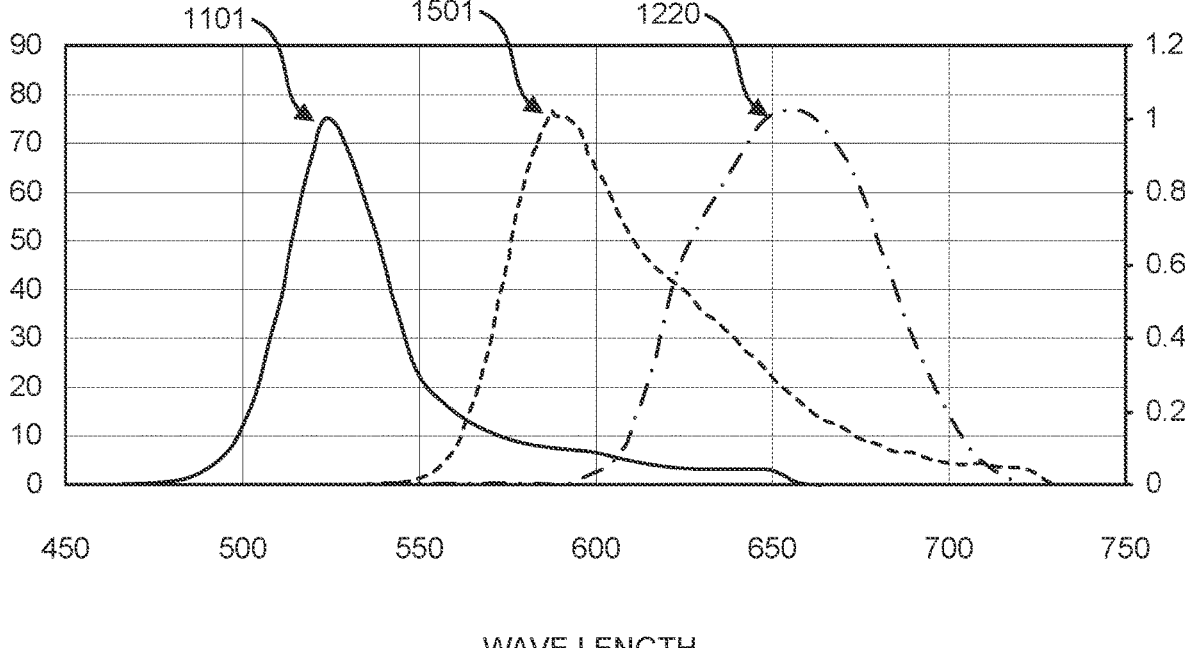

FIG. 2 is an example of a spectral profile coordination diagram illustrating targeted coordination between a wave-length range of excitation light, a wavelength range of signal light and a detection wavelength range. In the spectral profile coordination diagram of FIG. 2 spectral profile 1101 shown as a green light spectral profile is the spectral profile of excitation light 101 as emitted by light energy exciter 10. Spectral profile 1501 is the spectral profile of the emission light 501 caused by the fluorescence of a fluorophore on being excited by excitation light 101. Spectral profile 1220 is the transmission profile (detection band) of doped areas 212 defining sensing photodiodes according to one example. It will be understood that the spectral profile coordination diagram of FIG. 2 is intended to represent general features common to some examples, but that variations of the indicated spectral profiles are common. In one aspect, excitation light 101 can commonly include, in addition to a green light spectral profile, a blue light spectral profile (not shown) wherein system 100 is switchable between modes in which (a) the green light spectral profile is active with the blue light spectral profile being inactive, and (b) the blue light spectral profile is active with the green light spectral profile being inactive. In other examples, there can be different combinations of excitation light 101 and emission light. In one example, the spectral profile 1101 of excitation light 101 can feature a center wavelength in the blue light wavelength range and the spectral profile of emission light 501 can feature a center wavelength in the green wavelength range.

Detector 200 can be configured to detect light in the wavelength range indicated by spectral profile 1220. Spectral profile 1220 specifies the detection wavelength range with amplitude of spectral profile 1220 indicating a level of sensitivity. Thus, referring to the spectral profile coordination diagram of FIG. 2, detector 200 is able to detect emission light 501 in the range of wavelengths wherein the spectral profile 1501 of the emission light 501 and the detection band spectral profile 1220 of doped areas 212 defining sensing photodiodes intersect.

Detector 200 can include electron travel direction impacting features to increase the signal to noise ratio of system 100. Referring to FIG. 1, detector 200 can include substrate 202 and semiconductor formation 210. According to one example, semiconductor formation 210 can be provided by a silicon layer, e.g., a silicon layer defined on a bulk silicon wafer or silicon layer of an SOI wafer. Semiconductor formation 210 can include various features formed therein for improving the signal to noise ratio of system 100. Semiconductor formation 210 in another example, can be provided by a material other than silicon, e.g., graphene, gallium nitride, silicon carbide, gallium arsenide, germanium, or other Group IV semiconductor material.

Semiconductor formation 210 can include a plurality of spaced apart doped areas 212 formed in semiconductor formation 210, which spaced apart doped areas 212 can define sensing photodiodes. The plurality of spaced apart doped areas 212 can define an array of doped areas 212, wherein respective ones of the doped areas can define sensing photodiodes. In another aspect, semiconductor formation 210 can include a plurality of spaced apart doped regions 214 formed in semiconductor formation 210. The plurality of spaced apart doped regions 214 can define an array of spaced apart doped regions 214. Respective ones of doped regions 214 formed in semiconductor formation 210 can be associated to respective ones of doped areas 212 formed in semiconductor formation, which doped areas 212 can define sensing photodiodes. A respective doped area 212 configured as a sensing photodiode can generate a current signal in response to received electrons while doped region 214 can provide an electron travel direction impacting function.

Respective ones of doped regions 214 can be formed to be associated to and aligned with the respective doped area 212 of the plurality of doped areas 212. Each respective doped region 214 can be disposed forwardly of a respective associated doped area 212 in the path of emission light 501 from detector surface 206 at a location of samples 502 toward doped areas 212. Referring to doped areas 212, doped areas 212 can be doped to serve as sensing photodiodes while doped regions 214 can be configured to impact an electron travel direction. In one example, there is set forth herein a plurality of spaced apart doped regions 214 formed in semiconductor formation 210, wherein respective ones of the plurality of spaced apart doped regions 214 are associated to respective ones of the doped areas 212 defining sensing photodiodes, and wherein the respective ones of the doped regions 214 are disposed in a receive light path of the excitation light 101 and emission light 501 intermediate the detector surface 206 and the respective ones of the doped areas 212 defining sensing photodiodes. In one example, there is set forth herein a support structure 260 (supporting structure) defining a detector surface 206 configured for supporting biological or chemical samples 502; an array of doped areas 212 formed in a semiconductor formation 210, wherein the semiconductor formation 210 receives excitation light 101 and emission light 501 from the detector surface 206, and wherein doped areas 212 of the array of doped areas 212 define sensing photodiodes; a doped region 214 formed in the semiconductor formation 210 in a receive light path of the excitation light 101 and emission light 501 intermediate the detector surface 206 and a doped area 212 of the array of doped areas 212; and wherein the doped region 214 is configured to impact a travel direction of electrons generated in the doped region 214 as a result of photon absorption. As used herein, the phrase "from the detector surface" when used with regard to excitation light or emission light, it is intended to mean that the light is travelling from the detector surface, but not necessarily originating from the detector surface. For example, light from the detector surface may be light that is travelling through the detector surface.

In one example, doped areas 212 defining sensing photodiodes can be, e.g., n-doped regions in a p-substrate, or n-doped regions on a p-well on a n-doped substrate or any other diode combination. Semiconductor junction depth for instances of doped area 212 can be in the range of from about 0.2 um to about 2 um according to one example. DTI feature size can be from about 0.1 um to about 0.3 um in one example. The aspect ratio of DTI formations can be from about 1:5 to 1:25 according to one example. In one example, doped regions 214 providing an electron direction impacting function can be, e.g., n-doped regions in a p-substrate, or n-doped regions on a p-well on a n-doped substrate or any other diode combination. A junction depth of doped regions 214 can be selected in dependence on targeted wavelengths targeted for separation.

For alignment of respective ones of doping regions 214 to respective ones of doping areas 212, associated doping regions 214 and doping areas 212 can be arranged in one example to share a common vertically extending central axis 216, as shown in several of the views. In various shown examples, a vertically extending central axis 216 of an instance of doped area 212 can extend through doped region

214, and a vertically extending central axis 216 of an instance of doped region 214 can extend through an instance of doped area 212.

Figure 3:
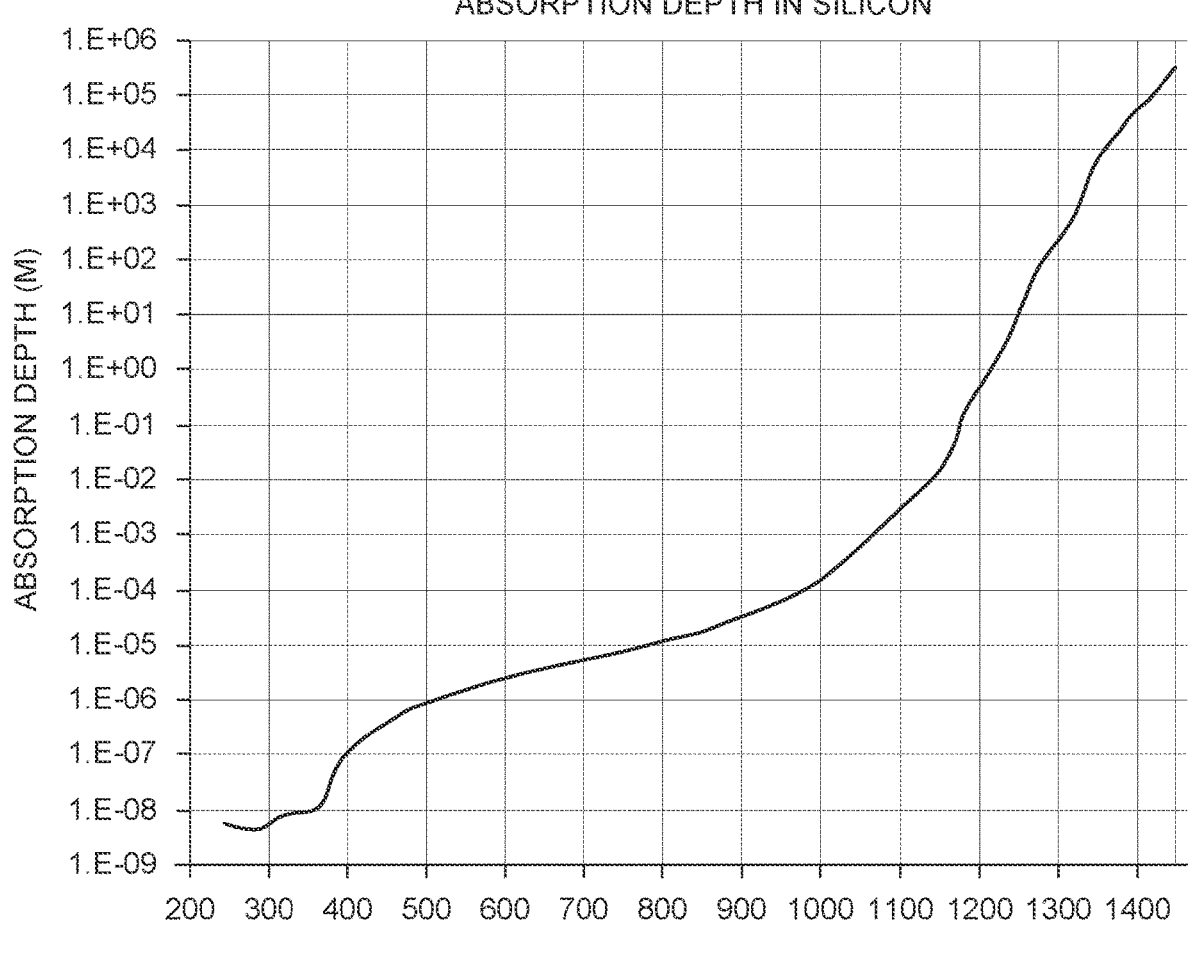
FIG. 3 depicts an absorption depth of light in silicon according to one example.

FIG. 3 depicts absorption depth of light through silicon at various wavelengths. Absorption depth refers to the inverse of the absorption coefficient, α. Absorption depth defines the distance from the surface into the material at which the light falls to 1/e (about 37%) of the original intensity. Examples herein recognize that the power of a wave in a certain medium is directly proportional to the square of the field quantity. Absorption depth herein further refers to the depth at which the wave power has dropped to $1/e^2$ (about 13%) of the surface value.

Examples herein can use absorption properties of light at different wavelengths to provide wavelength separation and selection. According to one example, doped regions 214 can be configured to impact electron travel direction to provide wavelength separation and selection and to improve a signal to noise ratio of system 100. A functional description of doped region 214 is set forth in reference to FIG. 4.

Examples herein recognize that a given semiconductor material absorbs more light at shorter wavelengths and, accordingly, that the absorption depth of a given semiconductor material is relatively shorter for shorter wavelengths and relatively longer for longer wavelengths. As the wavelength of light is increased, the absorption depth of light in a given semiconductor material is increased.

Examples herein can employ doped region 214 to provide wavelength separation and selection so that electrons generated within semiconductor formation 210 attributable to photon absorption of longer wavelengths of emission light 501 received within semiconductor formation 210 are preferentially received by doped areas 212 defining sensing photodiodes relative to electrons generated within semiconductor formation 210 attributable to photon absorption of shorter wavelengths of excitation light 101 received within semiconductor formation 210.

Examples herein recognize that in the absence of doped region 214, a majority of photons from both excitation light 101 and emission light 501 can be absorbed in an undoped area within semiconductor formation 210 to generate electrons whereupon the electrons can diffuse within semiconductor formation 210 in random directions until the electrons reach doped area 212 configured as a sensing photodiode. Examples herein from Eq. 1 recognize that receipt of a substantial percentage of electrons by doped area 212 generated from photon absorption of excitation light 101 can negatively impact a signal to noise ratio and the detection of emission light 501.

Examples herein can include doped region 214 configured to impact electron travel direction so that electrons generated from photon absorption within doped region 214 do not reach doped areas 212 defining sensing photodiodes.

In one aspect as set forth herein, doped region 214 defining semiconductor junction 215 can be configured so that a depth dimension of semiconductor junction 215 is selected in dependence on a targeted wavelength targeted for separation. In one example, by selecting a depth dimension of semiconductor junction 215 defined by doped region 214 to be longer than an absorption depth of a wavelength targeted for separation, electron generation attributable to photon absorption for the wavelength can be substantially and predominantly confined to doped region 214, wherein travel direction of the generated electrons can be impacted to avoid contribution of a traveling electron to a current signal generated by doped area 212 defining a sensing photodiode. The dimensions of doped region 214 including depth of semiconductor junction 215 can be controlled with use of doping parameters, which can include such parameters as doping concentration, doping location, and doping time.

Figure 4:
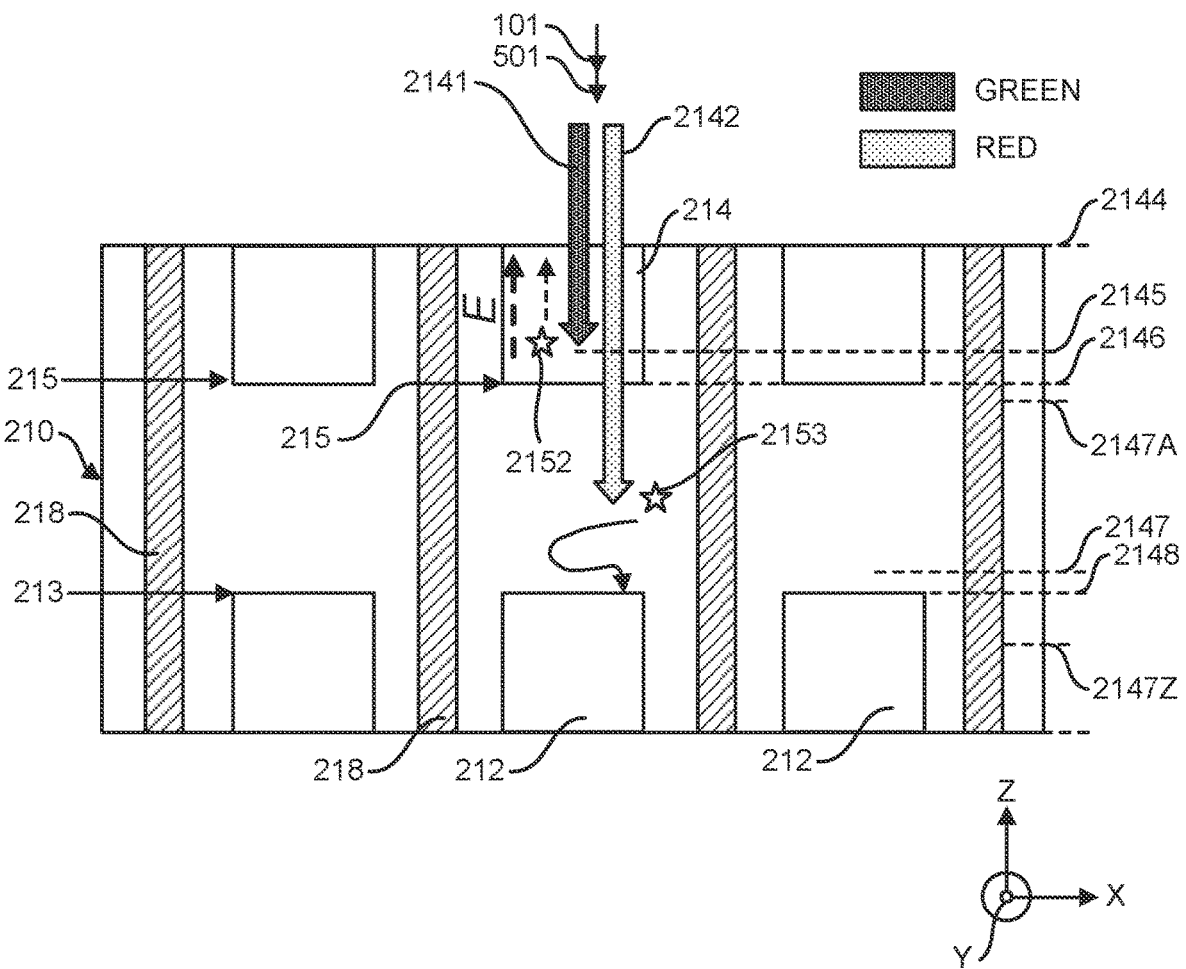
FIG. 4 is a schematic cutaway side view of a detector for use in biological or chemical analysis having a detector that includes a detector surface for supporting a biological or chemical sample according to one example.

In one example, instances of doped region 214 can be configured to feature a depletion region about semiconductor junction 215 so that electric field, E, is generated within doped region 214 as depicted in FIG. 4. Electric field, E, can be configured to impact a travel direction of electrons generated by absorption of photons within doped region 214. In one example, electric field, E, can impact a travel direction of photon generated electrons by causing drift of photon generated electrons generated by photo absorption within doped region 214. In one example, electric field, E, can impact a travel direction of photon generated electrons by causing drift of photon generated electrons generated by photo absorption within doped region 214 so that photon generated electrons generated within doped region drift toward a top light entry surface of doped region 214 defined at elevation 2144 of semiconductor formation 210. Doped region 214 can be configured to feature a depletion region about semiconductor junction 215 and can be configured to provide an electric field, E, that directs photon generated electrons toward a light entry surface of semiconductor formation 210 at elevation 2144. The electric field, E, can force electrons generated within doped region 214 to recombine without contribution to the current signal generated by doped area 212 defining a sensing photodiode. The generated electrons generated within doped region 214 can be restricted by electric field, E, from diffusing to reach doped area 212 defining a sensing photodiode on an opposite side of semiconductor formation 210.

In one example, doped region 214 herein can be configured to provide wavelength selection so that electrons attributable to photon absorption of emission light 501 in semiconductor formation 210 are preferentially received by doped area 212 defining a sensing photodiode relative to electrons attributable to photon absorption of excitation light 101 in semiconductor formation 210. In one example, doped region 214 herein can be configured to provide wavelength selection so that a percentage of photons of emission light 501 that absorb in semiconductor formation 210 below a junction depth of junction 215 to generate electrons that diffuse to reach doped area 212 defining a sensing photodiode is sufficient to facilitate the detection of emission light 501 received from detector surface 206 in the presence of illumination defining excitation light 101. In one example, doped region 214 herein can be configured to provide wavelength selection so that a percentage of photons of emission light 501 that absorb in semiconductor formation 210 below a junction depth of junction 215 to generate electrons that diffuse to reach doped area 212 defining a sensing photodiode relative to percentage of photons of excitation light 101 that absorb in semiconductor formation 210 below a junction depth of junction 215 to generate electrons that diffuse to reach doped area 212 defining a sensing photodiode is sufficient to facilitate the detection of emission light 501 received from detector surface 206 in the presence of illumination defining excitation light 101. In one example, doped region 214 herein can be configured to provide wavelength selection so that a percentage of electrons attributable to photon absorption of emission light 501 within semiconductor formation 210 that are generated below a junction depth of junction 215 to diffuse to reach doped area 212 defining a sensing photodiode is sufficient to facilitate the detection of emission light 501 received from detector surface 206 in the presence of illumination defining excitation light 101. In one example, doped region 214 herein can be configured to provide wavelength selection so that a percentage of electrons attributable to photon absorption of emission light 501 within semiconductor formation 210 that are generated below a junction depth of junction 215 to diffuse to reach doped area 212 defining a sensing photodiode, relative to a percentage of electrons attributable to photon absorption of excitation light 101 within semiconductor formation 210 that are generated below a junction depth of junction 215 to diffuse to reach doped area 212 defining a sensing photodiode, is sufficient to facilitate the detection of emission light 501 received from detector surface 206 in the presence of illumination defining excitation light 101.

In one example, doped region 214 can be configured to provide wavelength separation of excitation light 101 so that a percentage of photons of excitation light 101 absorbed in semiconductor formation 210 that are absorbed within doped region 214 to restrict resulting generated electrons from diffusing to reach doped area 212 defining a sensing photodiode is sufficient to facilitate detection of emission light 501 received from detector surface 206 in the presence of illumination defining excitation light 101.

In one example, doped region 214 can be configured to have a junction depth defined by an elevation 2146 of junction 215 greater than an absorption depth of a center wavelength of excitation light 101 or another targeted wavelength of light targeted for separation. By configuring doped region 214 so that semiconductor junction 215 features a depth greater than an absorption depth of a center wavelength of excitation light 101, a majority of photons at a center wavelength of excitation light 101 can be expected to be absorbed within doped region 214 to produce photon generated electrons within doped region 214, which electrons by the presence of electric field, E, can drift toward a top surface of doped region 214 without diffusing in random directions to reach doped area 212 defining a sensing photodiode.

By configuring doped region 214 so that semiconductor junction 215 features a depth at elevation 2146 greater than an absorption depth of center wavelength of excitation light 101, the percentage of photons at the center wavelength of excitation light 101 that are absorbed below a depth of semiconductor junction 215 at elevation 2146 can be limited, so that only a limited percentage of photons at a center wavelength of excitation light 101 are absorbed to generate electrons below elevation 2146 of junction 215, which electrons can diffuse in random directions to be received by doped area 212 to contribute to a current signal by doped area 212 defining a sensing photodiode. Limiting the percentage of photons absorbed below elevation 2146 at a given wavelength can limit the percentage of electrons generated as a result of photon absorption at the given wavelength. Limiting the percentage of electrons generated as a result of absorption of photons at a center wavelength of excitation light 101 that reach doped area 212 defining a sensing photodiode can facilitate detection of emission light 501.

While doped region 214 can include a junction depth of junction 215 at elevation 2146 so that only a limited percentage of photons at a center wavelength of excitation light 101 are absorbed to generate electrons below elevation 2146 of junction 215, the depth of semiconductor junction 215 at elevation 2146 can be configured so that a substantial percentage of photons at a center wavelength of emission light 501 can be absorbed below an elevation depth of junction 215 at elevation 2146 to generate electrons below elevation 2146 of junction 215, which electrons can diffuse in random direction to be received by doped area 212 to contribute to a current signal generated in response to received electrons by doped area 212 defining a sensing photodiode.

In one example, the junction depth of junction 215 at elevation 2146 can be configured so that a percentage of photons at a center wavelength of emission light 501 absorbed below elevation 2146 to generate electrons diffusing to reach doped area 212 defining a sensing photodiode, is greater than a percentage of photons at a center wavelength of excitation light 101 absorbed below elevation 2146 to generate electrons diffusing to reach doped area 212 defining a sensing photodiode. In one example, the junction depth of junction 215 at elevation 2146 can be configured so that a percentage of photons at a center wavelength of emission light 501 absorbed below elevation 2146 to generate electrons diffusing to reach doped area 212 defining a sensing photodiode, is about 2× or more greater than a percentage of photons at a center wavelength of excitation light 101 absorbed below elevation 2146 to generate electrons diffusing to reach doped area 212 defining a sensing photodiode. In one example, the junction depth of junction 215 at elevation 2146 can be configured so that a percentage of photons at a center wavelength of emission light 501 absorbed below elevation 2146 to generate electrons diffusing to reach doped area 212 defining a sensing photodiode, is about 10× or more greater than a percentage of photons at a center wavelength of excitation light 101 absorbed below elevation 2146 to generate electrons diffusing to reach doped area 212 defining a sensing photodiode. In one example, the junction depth of junction 215 at elevation 2146 can be configured so that a percentage of photons at a center wavelength of emission light 501 absorbed below elevation 2146 to generate electrons diffusing to reach doped area 212 defining a sensing photodiode, is about 20× or more greater than a percentage of photons at a center wavelength of excitation light 101 absorbed below elevation 2146 to generate electrons diffusing to reach doped area 212 defining a sensing photodiode. In one example, the junction depth of junction 215 at elevation 2146 can be configured so that a percentage of photons at a center wavelength of emission light 501 absorbed below elevation 2146 to generate electrons diffusing to reach doped area 212 defining a sensing photodiode, is about 50× or more greater than a percentage of photons at a center wavelength of excitation light 101 absorbed below elevation 2146 to generate electrons diffusing to reach doped area 212 defining a sensing photodiode.

In one example, the junction depth of junction 215 at elevation 2146 can be configured to be below an absorption depth of a center wavelength of excitation light 101 and above an absorption depth of a center wavelength of excitation light 101. By configuring doped region 214 so that the junction depth of junction 215 at elevation 2146 is below an absorption depth of a center wavelength of excitation light 101 and above an absorption depth of a center wavelength of excitation light, absorption of photons at a center wavelength of excitation light 101 below elevation 2146 can be limited, and absorption of photons at a center wavelength of emission light 501 below elevation 2146 can be substantially facilitated, so that doped area 212 receives by diffusion a substantial percentage of electrons generated within semiconductor formation 210 due to absorption of photons at a center wavelength of emission light 501 within semiconductor formation 210.

The percentage of electrons generated due to absorption of photons at a center wavelength of emission light 501 that diffuse to be received by doped area 212 defining a sensing photodiode can be sufficient to facilitate detection of emission light 501, particularly where the percentage of electrons generated due to absorption of photons at a center wavelength of excitation light 101 that diffuse to be received by doped area 212 defining a sensing photodiode is limited by the described wavelength separating and selecting functionality of doped region 214.

In one example, the junction depth of junction 215 at elevation 2146 can be configured to be at a depth of about 1× or more than the absorption depth of a center wavelength of excitation light 101. In one example, the junction depth of junction 215 at elevation 2146 can be configured to be at a depth of about 2× or more the absorption depth of a center wavelength of excitation light 101. In one example, the junction depth of junction 215 at elevation 2146 can be configured to be at a depth of about 1× or more the absorption depth of a center wavelength of excitation light 101. In one example, the junction depth of junction 215 at elevation 2146 can be configured to be at a depth of about 5× or more the absorption depth of a center wavelength of excitation light 101. In one example, the junction depth of junction 215 at elevation 2146 can be configured to be at a depth of about 7× or more the absorption depth of a center wavelength of excitation light 101. In any of the described examples, elevation 2146 can be configured to be at a depth of less than an absorption depth of a center wavelength of emission light 501.

The doping depth of doped region 214 defining a semiconductor junction 215 at elevation 2146 can be configured differently for different wavelengths of excitation light 101 and emission light 501. For example, if excitation light 101 includes a shorter wavelength (e.g., includes blue light rather than green light), a depth of doped region 214 can be configured to be shorter so that photon absorption and therefore photon absorption electron generation for the shorter wavelength light continues to be substantially and predominantly contained with doped region 214 while the area for absorption and electron generation attributable to longer wavelength light is lengthened for improved signal to noise ratio. If emission light 501 includes longer wavelengths (e.g., wavelengths at the long wavelength boundary of red), the depth of junction 215 at elevation 2146 can be lengthened to increase separation of excitation light 101, while still facilitating substantial photon absorption of emission light 501 below an elevation 2146 of semiconductor junction 215 sufficient for detection of emission light 501.

In one example, the depth of junction 215 can be configured so that (a) absorption of excitation light 101 can be substantially and predominantly confined to doped region 214, (b) so that absorption of excitation light 101 at elevations of semiconductor formation 210 below a depth of semiconductor junction 215 at elevation 2146 is limited, and (c) so that substantial absorption of emission light 501 occurs both above and below depth of semiconductor junction 215 at elevation 2146. In one example, the depth of semiconductor junction 215 at elevation 2146 can be configured so that a percentage of photons at a center wavelength of excitation light 101 absorbed below the elevation 2146 of semiconductor junction 215 is about 13 percent or less. In one example, the depth of semiconductor junction 215 at elevation 2146 can be configured so that a percentage of photons at a center wavelength of excitation light 101 absorbed below the elevation 2146 of semiconductor junction 215 is about 10 percent or less. In one example, the depth of semiconductor junction 215 at elevation 2146 can be configured so that a percentage of photons at a center wavelength of excitation light 101 absorbed below the elevation 2146 of semiconductor junction 215 is about 5 percent or less. In one example, the depth of semiconductor junction 215 at elevation 2146 can be configured so that a percentage of photons at a center wavelength of excitation light 101 absorbed below the elevation 2146 of semiconductor junction 215 is about 1 percent or less. In one example, the depth of semiconductor junction 215 at elevation 2146 can be configured so that a percentage of photons at a center wavelength of excitation light 101 absorbed below the elevation 2146 of semiconductor junction 215 is about 0.1 percent or less. In one example, the depth of semiconductor junction 215 at elevation 2146 can be configured so that a percentage of photons at a center wavelength of emission light 501 absorbed below the elevation 2146 of semiconductor junction 215 is about 13 percent or more. In one example, the depth of semiconductor junction 215 at elevation 2146 can be configured so that a percentage of photons at a center wavelength of emission light 501 absorbed below the elevation 2146 of semiconductor junction 215 is about 20 percent or more. In one example, the depth of semiconductor junction 215 at elevation 2146 can be configured so that a percentage of photons at a center wavelength of emission light 501 absorbed below the elevation 2146 of semiconductor junction 215 is about 40 percent or more.

Referring again to FIG. 2, excitation light 101 can feature the spectral profile 1101 as indicated in FIG. 2 which is a green light spectral profile and emission light 501 can feature the spectral profile 1501 as indicated in FIG. 2 which is a red light spectral profile. Referring to FIG. 4, the behavior of green light photon generated electrons is contrasted with that of red light photon generated electrons. FIG. 4 depicts the scenario where both excitation light 101 and emission light 501 are received from detector surface 206 and directed toward doped region 214 and doped area of semiconductor formation 210. In the described example set forth in FIG. 2, excitation light 101 can include green light (between about 500 nm and about 565 nm), and emission light 501 can include red light (between about 620 nm to about 750 nm).

The behavior of green light 2141 within semiconductor formation 210 is described with reference to FIG. 4. In an illustrative example, green light 2141 in the green wavelength band can exhibit an absorption depth within semiconductor formation 210 to a range of elevations about elevation 2145 so that a majority of green light received by semiconductor formation 210 is absorbed in doped region 214 between the elevation 2144 and elevation 2146 which elevation 2146 is the semiconductor junction depth elevation of semiconductor junction 215. Green light in the described scenario can be substantially and predominantly absorbed within doped region 214.

Electron 2152 depicts an electron generated by photon absorption within doped region 214. Electron 2152 generated by photon absorption within doped region 214, due to electric field, E, according to one example, can be expected to drift to a light entry surface of semiconductor formation 210 at a top elevation of doped region 214 at elevation 2144. Because a majority of green light photons (between about 500 nm and about 565 nm), can be expected to be absorbed at an absorption depth within an elevation depth of doped region 214, a majority of electrons generated as a result of green light photon absorption can be expected to exhibit the behavior of electron 2152; namely, can be expected to be directed to drift upward to the top surface at elevation 2144 of doped region 214.

The behavior of red light 2142 (between about 620 nm to about 750 nm) within semiconductor formation 210 is described with reference to FIG. 4. In an illustrative example, red light 2142 in the red wavelength band can exhibit an absorption depth (depth where intensity is about 1/e initial intensity and wave power is about $1/e^2$ initial wave power) within semiconductor formation 210 to a range of elevations about elevation 2147 so that a substantial percentage of red light photons received by semiconductor formation 210, are absorbed within semiconductor formation 210 at elevations below an elevation of semiconductor junction 215 of doped region 214.

Electron 2153 depicts an electron generated by photon absorption in an undoped region of semiconductor formation 210 below a bottom elevation 2146 of doped region 214 defined by semiconductor junction 215. Electron 2153 generated by photon absorption in an undoped region of semiconductor formation 210 below a bottom elevation of doped region 214 defined by junction 215, without the presence of electric field, E, at the location of absorption, can be expected to diffuse randomly, and eventually will be received at doped area 212, defining a sensing photodiode. Red light (between about 620 nm to about 750 nm), according to one configuration for semiconductor formation 210 can be expected to be absorbed in substantial percentages at elevation depths of semiconductor formation 210 i.e., between the elevations of 2144-2147. Red light photons can be expected be absorbed in substantial percentages at elevation depths of semiconductor formation 210 both within the elevation range of doped region 214 and below an elevation range of doped region 214.

Because red light can be expected to be substantially absorbed at all depths within the elevations 2144 and 2147 in the described scenario, a first substantial percentage of electrons generated as a result of red light photon absorption occurring within doped region 214 can be expected to exhibit the behavior of electron 2152, and a second substantial percentage of electrons generated as a result of red light photon absorption occurring within an undoped region of semiconductor formation below a bottom elevation 2146 of doped region 214 defined by junction 215 can be expected to exhibit the behavior of electron 2153.

Electron 2153 generated by photon absorption in an undoped region of semiconductor formation 210 below a bottom elevation of doped region 214 defined by junction 215, without the presence of electric field, E, at the location of absorption, can be expected to diffuse randomly, and eventually can be expected to be received at doped area 212 defining a sensing photodiode in order to contribute to a current sensed by doped area 212.

Elevation 2147 in the described example is an elevation above but proximate a top elevation of doped areas 212, that is below the elevation 2146 of junctions 215, but which is closer to a top elevation of doped areas 212 than elevation 2146. In the described example, semiconductor formation 210 can be configured so that an absorption depth of red light is defined about elevation 2147, proximate but above a top elevation of doped areas 212. It will be understood that semiconductor formation 210 can alternatively be configured to have different elevations for the absorption depth of red light within semiconductor formation 210 relative to structures therein depending on application, e.g., elevations between elevation 2147A below but proximate elevation of junctions 215, and elevation 2147Z intersecting doped areas 212. Examples herein recognize that identifying optimized configurations for different applications can be aided with use of optical system simulation software, such as the optical system simulation software OPTICSTUDIO® available from Zemax LLC.

Due to electric field, E, according to one example, electrons generated as a result of photon absorption within doped region 214 can be expected to drift to a light entry surface of semiconductor formation 210 at a top elevation of doped region 214 at elevation 2144. Because a majority of green light photons (between about 500 nm and about 565 nm), can be expected to be absorbed at an absorption depth within an elevation depth of doped region 214, the majority of electrons generated as a result of green light photon absorption can be expected to exhibit the behavior of electron 2152; namely, can be expected to be directed by electric field, E, to drift upward to the top light entry surface of semiconductor formation 210 at elevation 2144 of doped region 214 and semiconductor formation 210.

Examples herein recognize that an absorption depth of light in silicon is shorter for short wavelengths and longer for longer wavelengths. As the wavelength is increased the absorption depth of the light is increased. Since the emission light 501 from fluorophores has longer wavelengths than the excitation wavelengths of excitation light 101, the absorption depth of emission light 501 is deeper than the absorption depth of the shorter wavelength of excitation light 101. For wavelength separation herein, a semiconductor junction provided by doped region 214 can be created on semiconductor formation 210 by doping. The semiconductor junction defined by doped region 214 when designed correctly to feature a depletion region about junction 215 will present an electric field, E, that directs the photo-generated electrons toward a light entry surface of semiconductor formation 210 at elevation 2144. Electric field, E, can force these electrons that have generated as a result of photon absorption within doped region 214 to recombine so that the recombined electrons will not contribute to a current signal generated in response to received electrons by doped region 214 defining a sensing photodiode. The semiconductor junction and doping depth of doped region 214 can be engineered differently for different wavelengths of excitation light 101 and emission light 501. Electric field, E, within doped region 214 can force electrons generated by photon absorption within doped region 214 to drift toward a light entry surface of semiconductor formation 210 and recombine. The generated electrons generated within doped region 214 can be restricted by electric field, E, from diffusing to reach doped area 212 defining a sensing photodiode on an opposite side of semiconductor formation 210.

While FIG. 4 depicts the example of excitation light 101 being provided by green light, and emission light 501 being provided by red light, examples herein recognize that the depth of junction 215 can be configured to optimize wavelength separation of excitation light 101 for different combinations of excitation light 101 and emission light 501. In one example, a depth of semiconductor junction 215 can be optimized for wavelength separation of excitation light 101 where excitation light 101 is provided by blue light, and emission light 501 is provided by red light. In one example, a depth of semiconductor junction 215 can be optimized for wavelength separation of excitation light 101 where excitation light 101 is provided by blue light, and emission light 501 is provided by green light. As depicted in FIG. 4, doped regions 214 can be spaced apart from their associated doped areas 212 by a spacing distance. The spacing distance can be the distance between junction 215 at elevation 2146 and junction 213 of doped areas at elevation 2148. As depicted in FIG. 4, doped areas 212 can have common depth dimensions defined at junction 213 at elevation 2148. In one example, semiconductor formation 210 can be undoped in the portions of semiconductor formation 210 other than doped regions 214 and doped areas 212.

Figure 5:
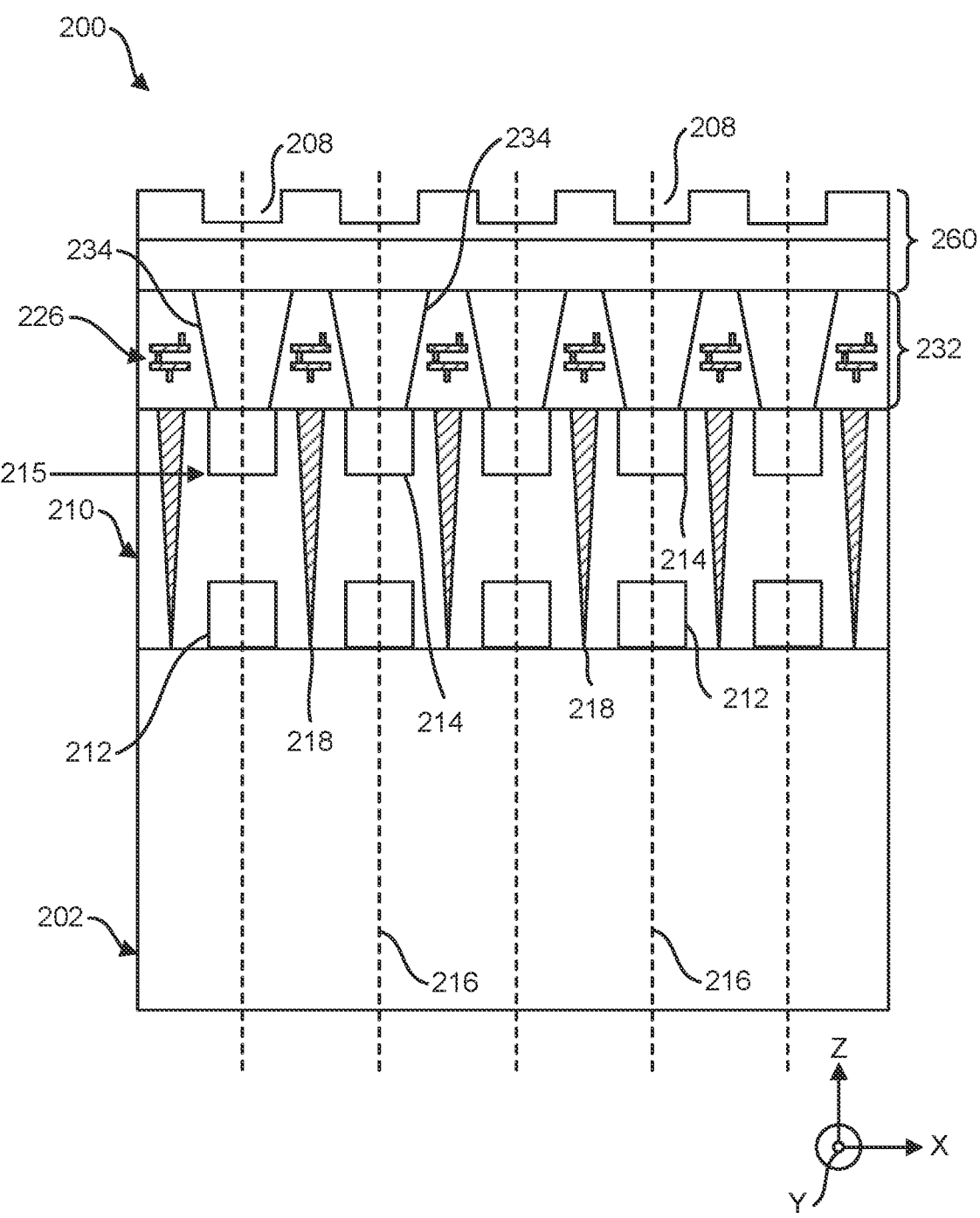
FIG. 5 is a schematic cutaway side view of a detector for use in biological or chemical analysis having a detector that includes a detector surface for supporting a biological or chemical sample according to one example.

Alternative methods for fabrication of detector 200 are described with reference to FIGS. 4 through 10. FIG. 5 illustrates detector 200 formed by way of a fabrication method in which a dielectric stack 232 having integrated therein one or more metallization layer 226 can be fabricated on a frontside of semiconductor formation 210.

For fabrication of detector 200 in the example of FIG. 5, doped areas 212 can be formed on a backside surface of semiconductor formation 210. For such formation of doped areas 212, the layer defining semiconductor formation 210 can be oriented upside down, e.g., using a handle wafer. Semiconductor formation 210 in all examples herein can be defined by a silicon layer. The silicon layer can be provided, e.g., by a layer defining a bulk silicon wafer or can be provided by silicon layer of silicon on insulator (SOI) wafer. Prior to doping to define doped areas 212, a surface of the silicon layer defining semiconductor formation 210 can be planarized. Semiconductor formation 210 in one example can be formed of a monolithic single piece of material, e.g., as provided by a silicon layer as set forth herein, provided, e.g., by a bulk silicon wafer, or a silicon layer of an SOI wafer, or a deposited silicon layer supported on a substrate.

Subsequent to the formation of doped areas 212, substrate 202, e.g., provided by a bulk silicon wafer, can be bonded to semiconductor formation 210, e.g., using thermal oxide bonding. Substrate 202 throughout the views, according to one example, can include a thickness in the range of from about 400 um to about 800 um in order to mechanically support silicon formation 210 and remaining structures fabricated thereon. The detector 200 in an intermediary fabrication stage having substrate 202 and semiconductor formation 210 can then be arranged vertically, upwardly, in the orientation as shown in FIG. 5 for further frontside fabrication processing.

Referring to further fabrication processing stages, doped regions 214 can be formed, e.g., using ion implantation. Prior to the formation of doped regions 214, the layer defining semiconductor formation 210 can be subject to planarization to reduce the elevation of semiconductor formation to the desired height. With doped regions 214 formed, trenches can be formed in semiconductor formation 210 by way of etching and the trenches can be filled with dielectric material to define deep trench isolation (DTI) formations 218 as shown in FIG. 1.

Throughout the examples, doped area 212 and doped region 214 can be fabricated using ion implantation and photo lithographic masks applied on planarized surfaces of semiconductor formation 210 to pattern instances of doped area 212 and doped region 214 to their desired locations.

Subsequent to the deposit of the dielectric material forming DTI formations 218, semiconductor formation 210 can be planarized to create planar surface for fabrication of additional structures. With a top surface of formation 210 planarized, dielectric stack 232 can be formed. Dielectric stack 232 can be formed via deposition and patterning processes on semiconductor formation 210. Dielectric stack 232 can have integrated therein one or more metallization layer 226 as well as patterned filters 234, there being associated one filter 234 to each respective doped area 212 defining a sensing photodiode. Filters 234 can be formed by etching trenches within dielectric stack 232 and filling trenches with use of filter material. On the depositing of filter material to define filters 234, the top surface of dielectric stack 232 can be planarized to facilitate depositing and patterning of one or more layer defining sample supporting structure 260. Filters 234 herein can feature light guiding functionality to guide light from the detector surface 206 toward doped areas 212 defining sensing photodiodes. Filters 234, accordingly to one example can comprise filter material. The filter material can block illumination forming excitation light 101 and permit light of emission light 501 to propagate toward respective doped regions 214 defining sensing photodiodes. The filter material can include in one example a dye suspended in a polymer matrix.

Reaction recesses 208 (nanowells) of sample supporting structure 260 can be created in a dielectric layer. Sample supporting structure 260 can comprise multiple, e.g., two or three different dielectrics. For example, sample supporting structure 260 can comprise SiN and TaOx (Ta2O5). Reaction recesses 208 (nanowells) can be created by lithography followed by etching.

Figure 6:
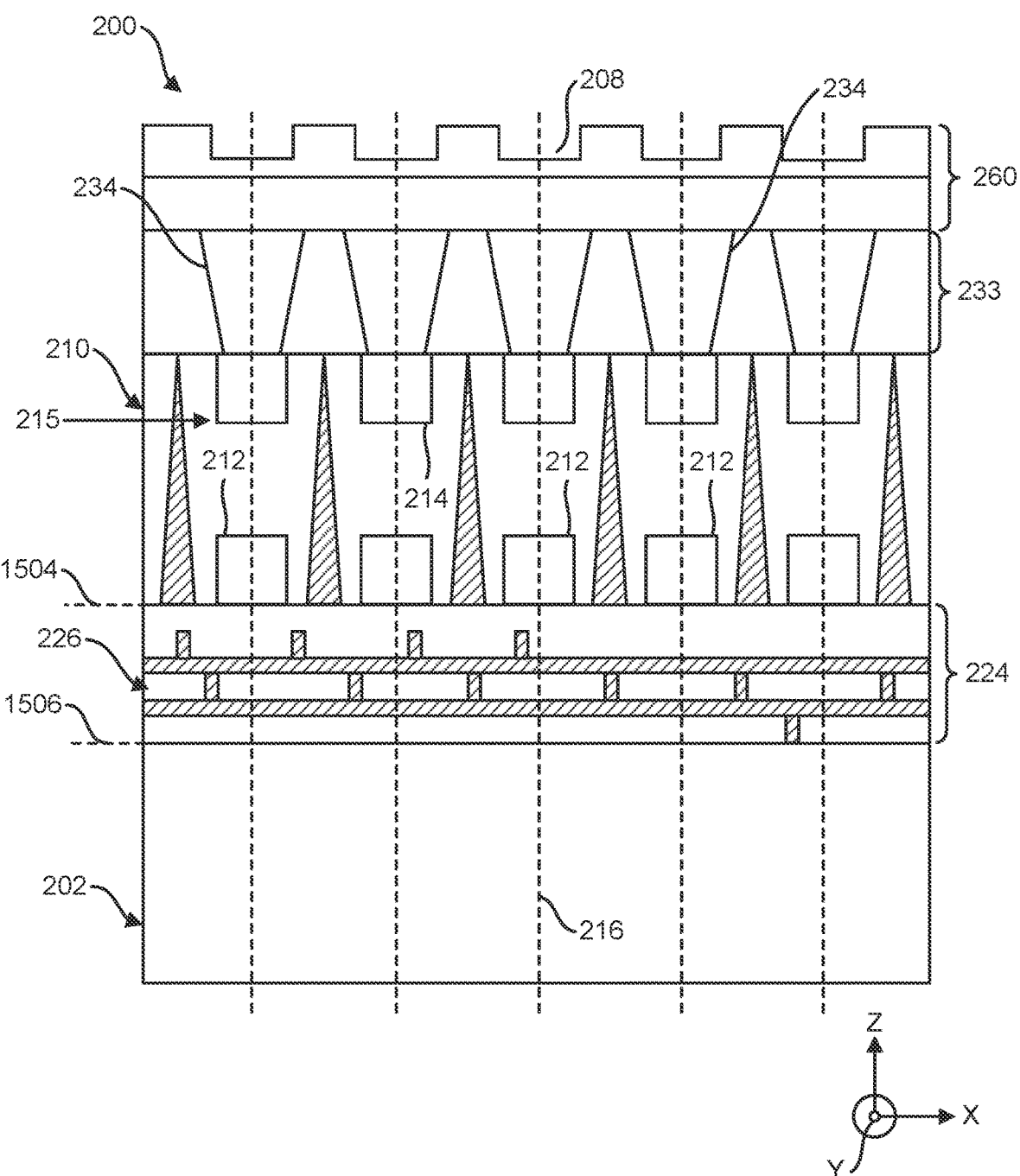
FIG. 6 is a schematic cutaway side view of a detector for use in biological or chemical analysis having a detector that includes a detector surface for supporting a biological or chemical sample according to one example.

FIG. 6 illustrates an example similar to the example of FIG. 5 with backside fabrication processing rather than frontside fabrication processing applied for the formation of dielectric stack 232 comprising filters 234. For the fabrication of the detector 200, shown in FIG. 6, the structure defining semiconductor formation 210, e.g., bulk wafer or SOI wafer can be oriented in the orientation shown as an initial fabrication stage. In one example, the surface of the structure defining semiconductor formation 210 can be subject to planarization and then doped regions 214 can be formed. The resulting semiconductor formation 210 in an intermediary fabrication stage can then be flipped upside down to facilitate frontside fabrication processing of semiconductor formation 210. The frontside fabrication processing can include planarizing the structure defining semiconductor formation 210 down to a desired thickness of semiconductor formation 210. With the desired thickness of semiconductor formation 210 achieved, doped areas 212 can be formed, e.g., via ion implantation. Subsequently, trenches can be formed by etching between the doped regions 214 and the formed trenches can be subsequently filled with dielectric material to define DTI formations 218. Semiconductor formation 210 can be subject to planarization to remove excess portions of the dielectric material.

Subsequently, with the frontside surface of semiconductor formation 210 defined at elevation 1504, dielectric stack 224 can be formed on a frontside top side of semiconductor formation 210 via deposition and etching processes. There can be fabricated within dielectric stack 224 one or more metallization layer 226 which can define circuitry, e.g., for readout of signals from doped areas 212 defining sensing photodiodes, digitization, storage and/or signal processing.

Subsequently, with dielectric stack 224 fabricated, dielectric stack 224 can be planarized and then substrate 202 can be attached to a topside surface of dielectric stack 224 at elevation 1506 via bonding, e.g., oxide bonding. Then the structure as shown in FIG. 6 in an intermediary fabrication stage can be reoriented in the orientation shown in FIG. 6 to facilitate backside fabrication processing of detector 200. With semiconductor formation 210 in the orientation shown, dielectric stack 233 can be fabricated via deposition and etching fabrication processing. Dielectric stack 233 can be absent of any metallization layer. There can be fabricated in dielectric stack 233, one filter 234 for each respective doped area 212 defining a sensing photodiode.

According to one example, dielectric stack 233 as shown in FIG. 6 can provide improved performance relative to dielectric stack 232 as shown in FIG. 5 by reason of being absent of one or more metallization layer 226 which in the example of FIG. 6 is on the frontside of semiconductor formation 210. For the fabrication of filters 234, trenches can be etched in dielectric stack 233 and then subject to planarization. With a top surface of dielectric stack 233 planarized, sample supporting structure 260 comprising one or more deposited layer can be formed via deposition and etching fabrication processing.

Figure 7:
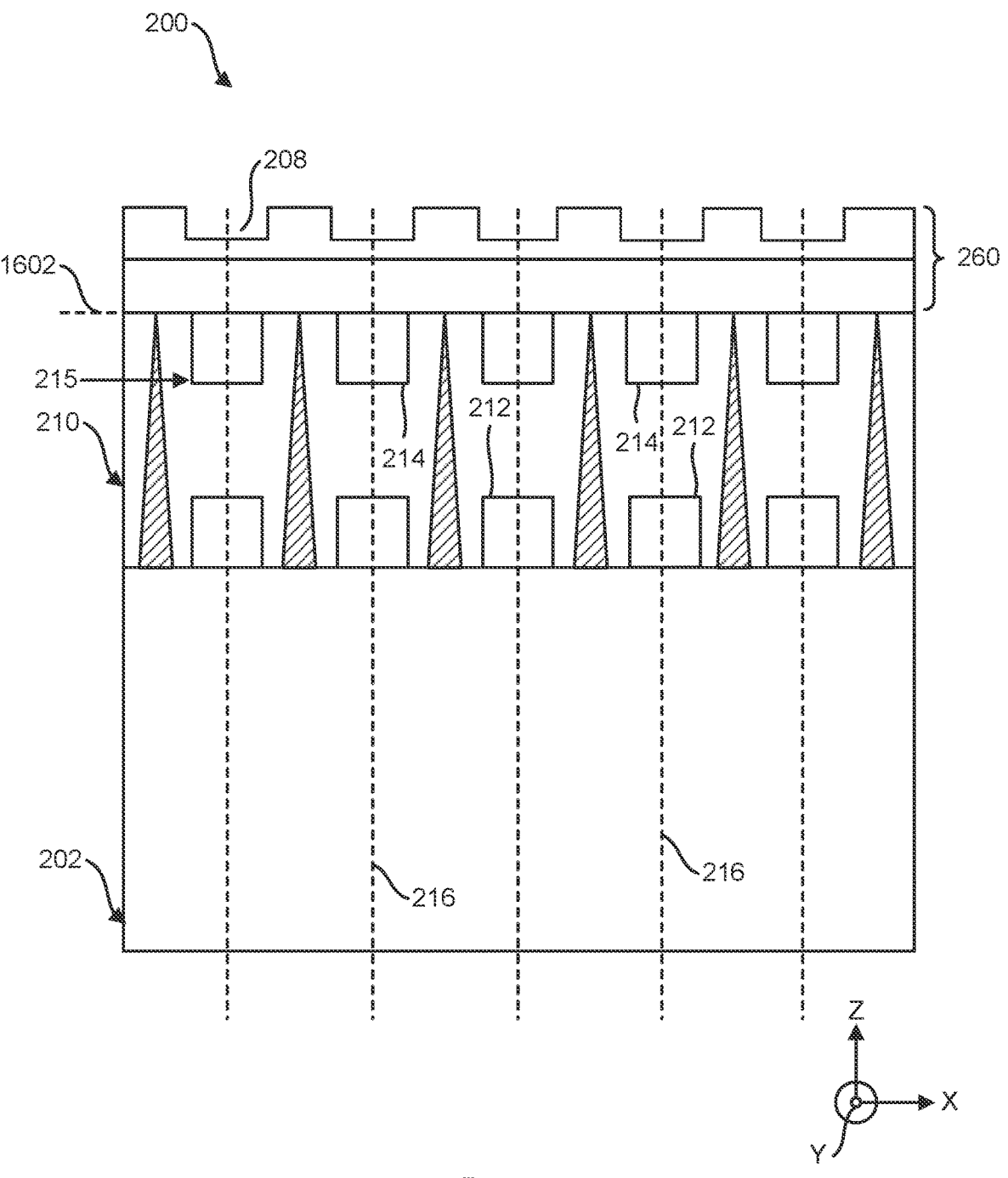
FIG. 7 is a schematic cutaway side view of a detector for use in biological or chemical analysis having a detector that includes a detector surface for supporting a biological or chemical sample according to one example.

The example of FIG. 7 is similar to the example of FIG. 6 in that the example of FIG. 7 uses backside fabrication processing, similar to the fabrication processing of FIG. 6 except that dielectric stack 233 having filters 234 is deleted and sample supporting structure 260 for sample holding is fabricated directly on a backside surface of semiconductor formation 210. Semiconductor formation 210 in one example can be planarized to elevation 1602, and then sample supporting structure 260 can be fabricated on a backside surface of semiconductor formation 210 at elevation 1602 using appropriate fabrication processing comprising depositing and patterning, Examples herein recognize that filters 234 associated to respective doped areas 212 defining sensing photodiodes can block illumination forming excitation light 101. However, the electron travel direction impacting functionality of doped regions 214 can be sufficient to render filters 234 unnecessary in some examples.

Examples herein recognize that the described electron travel direction impacting functionality of doped regions 214 can significantly reduce the thickness requirements of detector 200. For example, by the electron travel direction impacting functionality of doped regions 214, filters 234 can be eliminated or their thickness can be reduced.

Figure 8:
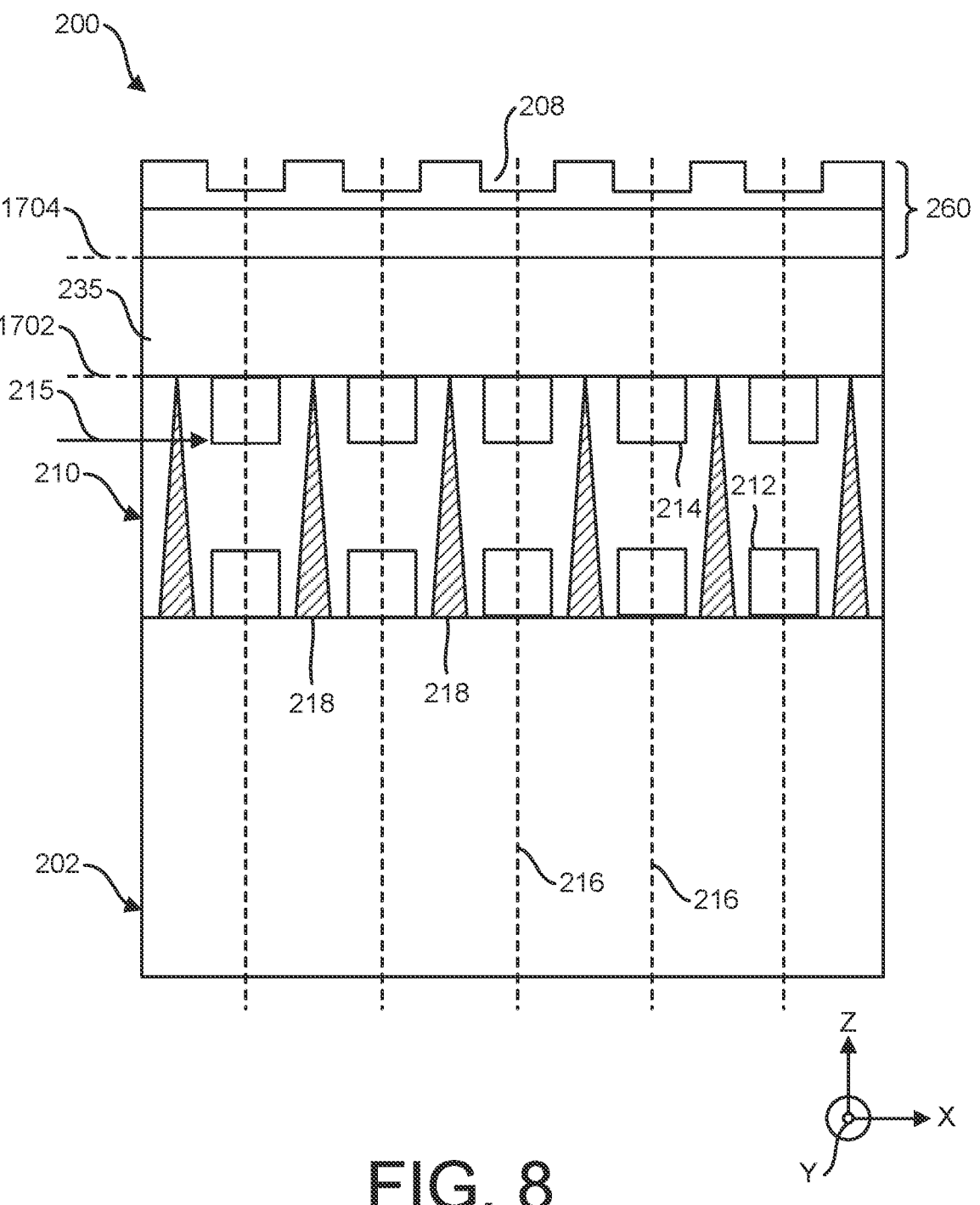
FIG. 8 is a schematic cutaway side view of a detector for use in biological or chemical analysis having a detector that includes a detector surface for supporting a biological or chemical sample according to one example.

Referring to the example of FIG. 8, the example of detector 200 as shown in FIG. 8 is similar to the example of detector 200 shown in FIG. 6, except that dielectric stack 233, having filters 234 provided by patterned filters can be replaced by a monolithic filter 235. Monolithic filter 235 can be deposited on a backside surface of semiconductor formation 210 at elevation 1702 and after deposition can be subject to planarization to reduce a thickness of monolithic filter 235 to elevation 1704, after which sample supporting structure 260 can be fabricated, e.g., by depositing and patterning sample supporting structure 260 on a top surface of monolithic filter 235 defined at elevation 1704. Monolithic filter 235 can be configured so that vertically extending central axes 216 of multiple ones of doped areas 212 extend through monolithic filter 235.

Figure 9:
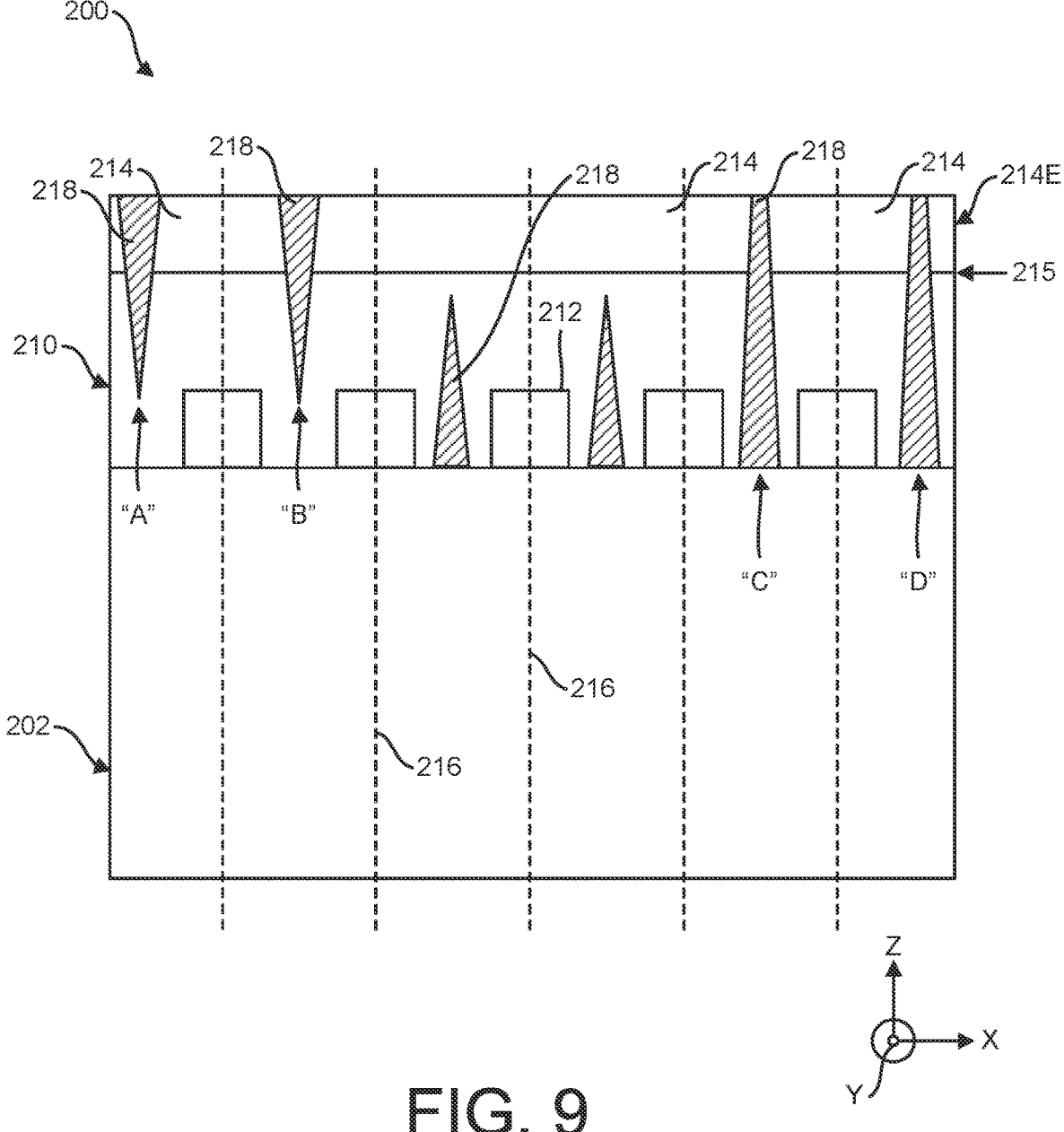
FIG. 9 is a schematic cutaway side view of a detector for use in biological or chemical analysis having a detector that includes a detector surface for supporting a biological or chemical sample according to one example.

The example of detector 200 as shown in FIG. 9 illustrates that DTI formations 218 can be formed by etching trenches that narrow either towards a frontside or alternatively a backside of semiconductor formation 210. In addition, the example of detector 200 as shown in FIG. 9 illustrates an alternative method for the fabrication of doped regions 214. In the examples of FIGS. 1, 4 through 8, doped regions 214 can be formed using a lithographic mask for patterning the locations of doped regions 214. In the example shown in FIG. 9, ion implantation can be carried out to define an extended doped region 214E that extends continuously along a surface of semiconductor formation 210 as shown, and separated doped regions 214 can be defined by the fabrication of trenches used for the fabrication of DTI formations 218 (see example DTI formations at "A", "B", "C" and "D"). The extended doped region 214E can be formed on a light entry surface of semiconductor formation 210, which can be a frontside surface of semiconductor formation 210 (e.g., as shown in FIG. 5) or a backside surface of semiconductor formation (e.g., as shown in FIG. 6). Extended doped region 214E can be configured so that vertically extending central axes 216 of multiple ones of doped areas 212 extend through extended doped region 214E. In the example of FIG. 9, doped regions 214 can extend laterally to contact DTI formations 218 to eliminate photon absorption in undoped areas of semiconductor formation 210 laterally adjacent to doped regions 214. The feature described in reference to FIG. 9, wherein doped regions 214 extend laterally to contact DTI formations can be incorporated into any of the remaining examples herein. Referring to FIG. 9 extended doped region shown as extending laterally can be regarded to be a laterally extended doped region. There is set forth herein in reference to FIG. 9, a method wherein the forming in the semiconductor formation an array of doped regions comprises forming a laterally extended doped region 214E that laterally extends to oppose a plurality of doped areas 212 of the array of doped areas 212 such that respective central axes 216 of the plurality of doped regions commonly extend through the laterally extended doped region 214E (see FIG. 9), etching the laterally extended doped region 214 to define trenches, and filling the trenches with dielectric material to define DTI formations 218 that separate the laterally extended doped region 214E into respective ones of the doped regions 214 defining the array of doped regions 214.

DTI formations 218 can be created in different ways. For example, as shown in FIG. 9, DTI formations 218 can be formed on the backside toward the frontside, DTI formations 218 can be formed on the frontside toward backside but not go all the way through, or DTI formations 218 can be formed on the frontside toward backside but go all the way through semiconductor formation 210.

Figure 10:
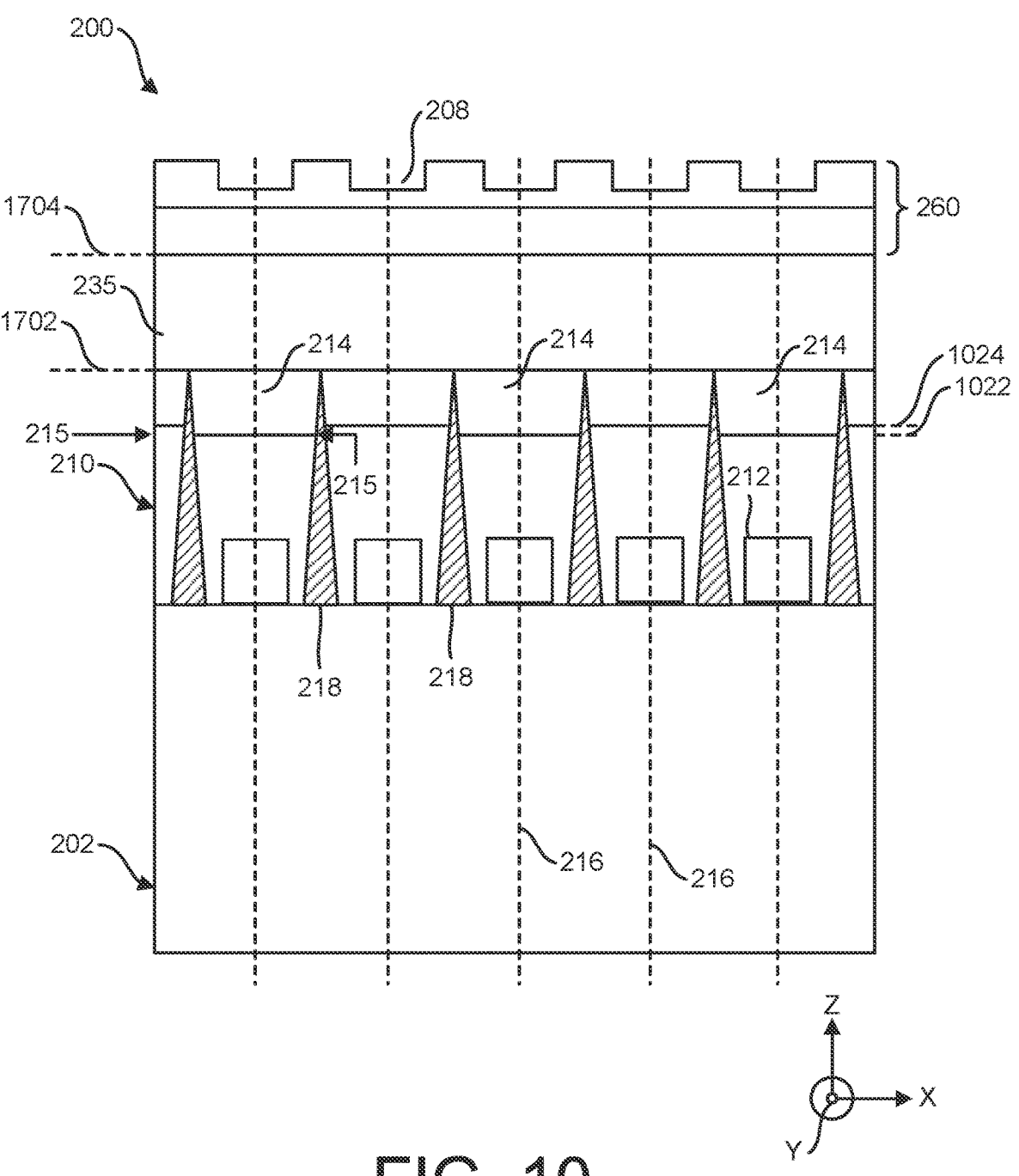
FIG. 10 is a schematic cutaway side view of a detector for use in biological or chemical analysis having a detector that includes a detector surface for supporting a biological or chemical sample according to one example.

Now referring to FIG. 10, another example of detector 200 is shown. In the example of FIG. 10, doped regions 214 can be configured to have first and second junction depths. A first set of doped regions 214 can have junction depths defined at relatively deeper elevation 1022 and the second set of doped regions 214 can have junction depths at relatively shallower elevation 1024. Junctions 215 at the deeper elevation 1022 can be optimized for separating excitation light 101 of relatively longer wavelengths (e.g., green light) while optimizing emission light absorption below the elevation 1022, and the semiconductor junctions 215 at shallower elevation 1024 can be optimized for separating excitation light 101 of relatively shorter wavelengths (e.g., blue light) while optimizing emission light absorption below the elevation 1024. Light energy exciter 10 in the example of FIG. 10 can be configured to selectively direct excitation photons to respective ones of reaction recesses 208 at first and second different times. For example, reaction recesses 208 can be irradiated at a first time with any suitable number of laser beams that interfere with one another in such a manner as to generate a first optical intensity pattern of a first wavelength that selectively excites a first set of reaction recesses 208 associated to the first set of doped regions 214 at the first time, and can be irradiated at a second time with any suitable number of laser beams that interfere with one another in such a manner as to generate a second optical intensity pattern of a second wavelength that selectively excites a second set of reaction recesses 208 associated to the second set of doped regions 214 at the second time. Light energy exciter 10 in the example of FIG. 10, can alternatively be configured to commonly excite substantially all reaction recesses 208 of detector 200 simultaneously at a common time. "Substantially all" herein includes and encompasses the instance of "literally all". FIG. 10 depicts a pattern wherein doped regions 214 at adjacent pixel positions (FIG. 13) have alternating junction depths of a first deeper junction depth and a second shallower junction depth. The same pattern can be repeated in the depth dimension so that the doped region 214 at each pixel position, e.g., C2, has neighboring doped regions at four corner adjacent pixel positions (e.g., B1, B3, D3, and D1 relative to C2) with a common junction depth (e.g. all deeper or all shallower), and neighboring doped regions 214 at four side adjacent pixel positions (e.g., C1, B2, C3, D2 relative to C2) with different junction depths relative to its own junction depth.

According to a principle of operation of detector 200, doped regions 214 can be configured so that an absorption depth of longer wavelength (for example red light) extends beyond a depth of doped regions 214 defined by semiconductor junctions 215, while an absorption depth of unwanted light such as unwanted excitation light 101 does not extend beyond a depth of doped regions 214 defined by semiconductor junctions 215. The longer wavelength light can be partially absorbed in doped region 214, wherein electrons generated from the absorption can drift toward a light entry surface of semiconductor formation 210; however, a significant percentage of the longer wavelength light can be absorbed in an undoped region of semiconductor formation 210 below an elevation of semiconductor junction 215 to generate electrons that diffuse in random directions, and which can reach doped area 212 defining a sensing photodiode.

When emission light 501 defining longer wavelength light is absorbed below a bottom elevation 2146 (FIG. 4) of doped region 214 defined by junction 215, photon absorption generated electrons attributable to longer wavelength light can be generated that will reach doped area 212 defining a sensing photodiode by diffusion. The shorter wavelength light (for example green or blue) will be mostly absorbed within an elevation of semiconductor formation 210 above a bottom elevation 2146 of doped region 214 defined by junction 215. This leads to photon generated electrons, but these electrons generated within doped region 214 will be forced to drift toward the light entry surface of semiconductor formation 210 because of the presence of the electric field, E, created by doped region 214.

Figure 13:
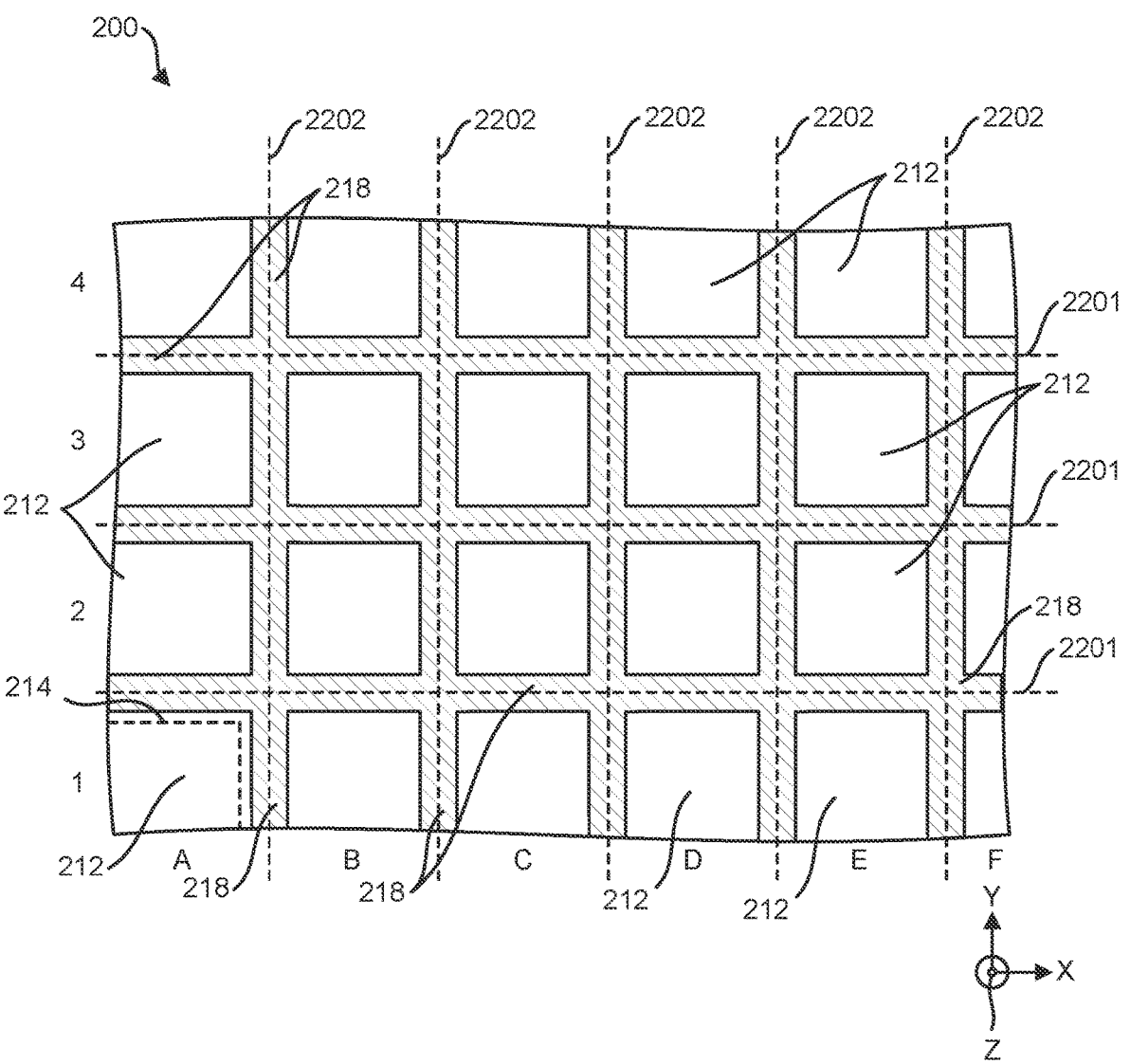
FIG. 13 is a schematic cutaway top view of a detector for use in biological or chemical analysis having a detector that includes a detector surface for supporting a biological or chemical sample according to one example.

Examples herein recognize that by performing the described wavelength selection inside semiconductor formation 210 using doped region 214, examples of system 100 can be provided having a variety of distinct features which can be characterized by doped region 214 as well as additional features facilitated by the functioning of doped region 214. For example, filters 234 can be deleted, or their size, including height, can be significantly reduced. With an aspect ratio of filters 234 significantly reduced or with filters 234 eliminated altogether, a diameter dimension of doped areas 212 defining sensing photodiodes can be reduced, e.g., to dimensions of about 1.0 μm or less, in order to facilitate a higher pixel density (characterized by an increased number of pixel positions over a given area in the X-Y plane as depicted in FIG. 13). In another example, doped regions 214 can facilitate a reduction of diameter dimension of doped areas 212 defining sensing photodiodes to less than 1.0 um. Accordingly, certain benefits and advantages may be achieved according to one or more of the examples described herein, including simplified or more efficient manufacturing, higher pixel density (smaller pitch), and improved performance.

Examples herein recognize that without doped region 214 removal of signal attributable to excitation light 101 can be reliant on filter 234, leading to filters with significant thicknesses and aspect ratios. For example, when feature size is 0.2 um with aspect ratio of 1:20 then the trench can extend to about 4 um deep or longer into semiconductor formation 210, imposing fabrication challenges. Fabrication challenges can be posed by the height and aspect ratios of filters 234. Examples herein recognize that challenges can be imposed by the integration of filters 234 which can provide light guiding functionality. Examples herein recognize that this difficulty can be increased as pitch of doped areas 212 defining sensing photodiodes is reduced, making the aspect ratio of filters 234 having light guiding functionality more challenging. Trenches for the formation of filters 234 can be difficult to fill, leading to flaws in a filter configuration. Examples herein recognize that further reducing filter thickness may be difficult if at all possible when filter pitch is reduced to a pitch of about 3.0 um to about 3.5 um.

Examples herein can facilitate the elimination of filters 234 or the use of filters having reduced thickness, which by their reduced thickness remove fabrication challenges. Filters 234 herein can include wavelength selective filters that are configured for blocking of wavelengths of a first wavelength range and transmitting of wavelengths of a second wavelength range. Filters 234 herein can be configured to block wavelengths of excitation light 101 and can be further configured to transmit wavelengths of emission light 501. Filters 234 herein according to one example can be provided by material that includes a dye suspended in a polymer matrix. Filters 234 herein according to one example can be provided by organic filters. As set forth herein, examples can facilitate the elimination of filters 234. Examples herein recognize that elimination of filters 234 can remove challenges of materials processing compatibility in a wafer built structure defined by detector 200. The functioning of filters 234 for performance of wavelength selection can be distinguished from the functioning of semiconductor formation 210 having doped regions 214 for performance of wavelength selection. In one example, the functioning of filters 234 for performance of wavelength selection can be based on heat being generated as a result of photon absorption (which photon absorption has characteristics that vary in dependence on wavelength), whereas the functioning of semiconductor formation 210 having doped regions 214 for performance of wavelength selection can be based on electrons being generated as a result of photon absorption (which photon absorption has characteristics that vary in dependence on wavelength), wherein generated electrons can drift or diffuse as set forth herein.

As set forth herein, doped region 214 defining semiconductor junction 215 can be configured so that a depth dimension of semiconductor junction 215 is selected in dependence on a wavelength or range of wavelengths targeted for separation. In one example, by selecting a depth dimension of semiconductor junction 215 defined by doped region 214 to be longer than an absorption depth of a wavelength targeted for separation, electron generation attributable to photon absorption for the wavelength can be substantially and predominantly confined to doped region 214, wherein travel direction of the generated electrons can be impacted to avoid contribution of a traveling electron to a current signal generated by doped area 212 defining a sensing photodiode. The dimensions of doped region 214 including depth of semiconductor junction 215 can be controlled with use of doping parameters, which can include such parameters as doping concentration, doping location, and doping time.

In one example, doped region 214 can be formed with use of thermal diffusion doping. Thermal diffusion doping can include a deposition stage and a diffusion stage. In a deposition stage, a dopant can be applied to a surface to be doped. In a diffusion stage, thermal energy can be applied to diffuse the dopant to a targeted diffusion depth beneath the surface to be doped.

In some examples of fabricating system 100, thermal budget can be managed to facilitate the formation of doped region 214 to exhibit a targeted depth dimension. Examples herein recognize that thermal budget restrictions can restrict the depth dimension of doped region 214. Examples herein can include fabrication methods that increase a thermal budget associated to a stage for fabricating doped region 214 and therefore increase a depth dimension of semiconductor junction 215 of doped region 214 that is achievable with use of thermal diffusion doping.

In various examples, a dielectric stack integrating one or more metallization layer, e.g., dielectric stack 232 as shown in FIG. 5, or dielectric stack 224 as shown in FIG. 6 can be deposited on semiconductor formation 210. Examples herein recognize that a presence of a metallization layer on an in-fabrication wafer can restrict a thermal budget associated to the formation of doped regions 214.

Examples herein, e.g., in relation to FIG. 5 and FIG. 6 feature fabrication methods wherein for expansion of thermal budget associated to formation of doped regions 214, doped regions 214 can be formed prior to deposition of a dielectric stack integrating a metallization layer.

In the example of FIG. 5, doped regions 214 can be formed prior to the deposition of dielectric stack 232, and therefore can be fabricated with an essentially unrestricted thermal budget (e.g., without risk to structural and/or performance degradation to prior fabricated metallization features).

In the example of FIG. 6, doped regions 214 can be fabricated as the initially fabricated features within semiconductor formation 210, and therefore can be fabricated with an essentially unrestricted thermal budget (e.g., without risk to structural and/or performance degradation to prior fabricated metallization features).

Each of the examples of FIG. 5 and FIG. 6 can employ wafer flipping to facilitate the formation of doped regions 214 prior to the depositing of a dielectric stack integrating a metallization layer.

In the example of FIG. 5, doped areas 212 can be formed as the initially formed feature of semiconductor formation 210, and then wafer flipping can be employed to flip the wafer defining semiconductor formation 210 so that semiconductor formation 210 is in the orientation shown in FIG. 5. With the wafer defining semiconductor formation 210 in the orientation shown in FIG. 5, doped regions 214 can be formed, and with the wafer defining semiconductor formation retained in the orientation depicted in FIG. 5 dielectric stack 232 integrating one or more metallization layer 226 can be deposited on semiconductor formation 210.

In the example of FIG. 6, doped regions 214 can be formed as the initially formed feature of semiconductor formation 210, and then wafer flipping can be employed to flip the wafer defining semiconductor formation 210 so that semiconductor formation 210 is in the reverse orientation from that shown in FIG. 6. With the wafer defining semiconductor formation 210 in the reverse orientation shown in FIG. 6 doped areas 212 can be formed, and with the wafer defining semiconductor formation retained in the orientation reverse from that depicted in FIG. 6 dielectric stack 224 integrating one or more metallization layer 226 can be deposited on semiconductor formation 210.

Depending on application, it may be advantageous to delay fabrication of doped regions 214 to a later stage subsequent to an initial feature fabrication stage.

In some examples, it can be advantageous for a given application to fabricate doped areas 212 as an initially fabricated feature of semiconductor formation 210 rather than doped regions 214. In one variation of such example, with a wafer defining semiconductor formation 210 in reverse orientation from that shown in FIG. 6, doped area 212 can be fabricated as an initially formed feature of semiconductor formation by ion implantation using an appropriate doping process, e.g., thermal diffusion.

With doped areas 212 formed, a surface of semiconductor formation 210 can be planarized to elevation 1504. A handle wafer (not shown) can be applied to attach to semiconductor formation 210 at the surface defined at elevation 1504 and semiconductor formation 210 can be held in reverse orientation (i.e., the orientation depicted in FIG. 6). Then, doped regions 214 can be formed, e.g., by ion implantation using thermal diffusion.

With doped regions 214 formed, and semiconductor formation 210 planarized to a top elevation of the depicted doped regions 214, and a second handle wafer (not shown) can be attached to semiconductor formation 210 at the described top elevation of doped regions 214 (elevation 2144 in FIG. 4). Semiconductor formation 210 can be flipped again (to the orientation reverse that shown in FIG. 6). Then, semiconductor formation 210 can be subject to frontside fabrication processing to fabricate dielectric stack 224 that integrates one or more metallization layer 226 which can define circuitry, e.g., for readout of signals from doped areas 212 defining sensing photodiodes, digitization, storage and/or signal processing. Thus, in reference to the described variation, another fabrication method employing wafer flipping to facilitate expansion of thermal budget associated to the formation of doped regions 214 is described.

Alternative to the described fabricating according to the variation described in reference to FIG. 6, dielectric stack 224 integrating one or more metallization layer 226 can be deposited on semiconductor formation 210 immediately after formation of doped areas 212 and planarization to elevation 1504, the handle wafer for use in fabricating doped regions 214 can be attached at elevation 1506 after fabrication of dielectric stack 224, rather than at elevation 1504 after fabrication of doped areas 212 and before fabrication of dielectric stack 224 that can integrate the one or more metallization layer 226 defining the described circuitry, e.g., for readout of signals from doped areas 212 defining sensing photodiodes, digitization, storage and/or signal processing. While such fabricating can be advantageous for various applications, examples herein recognize that thermal budget associated to the fabrication of doped regions 214 can be increased by fabricating doped regions 214 prior to fabrication of dielectric stack 224 that can integrate the one or more metallization layer 226 defining the described circuitry.

Figure 11:
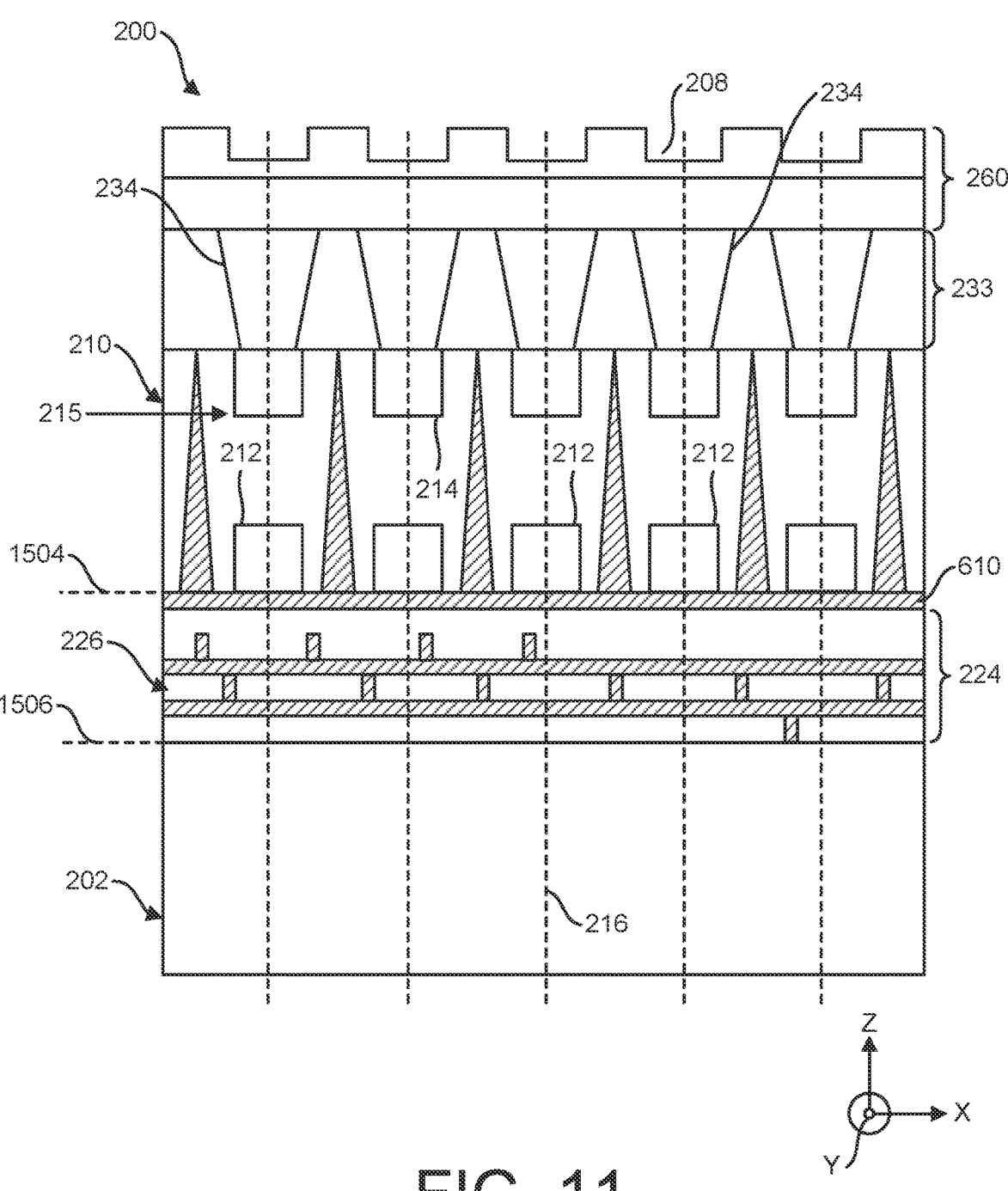
FIG. 11 is a schematic cutaway side view of a detector for use in biological or chemical analysis having a detector that includes a detector surface for supporting a biological or chemical sample according to one example.
Figure 12:
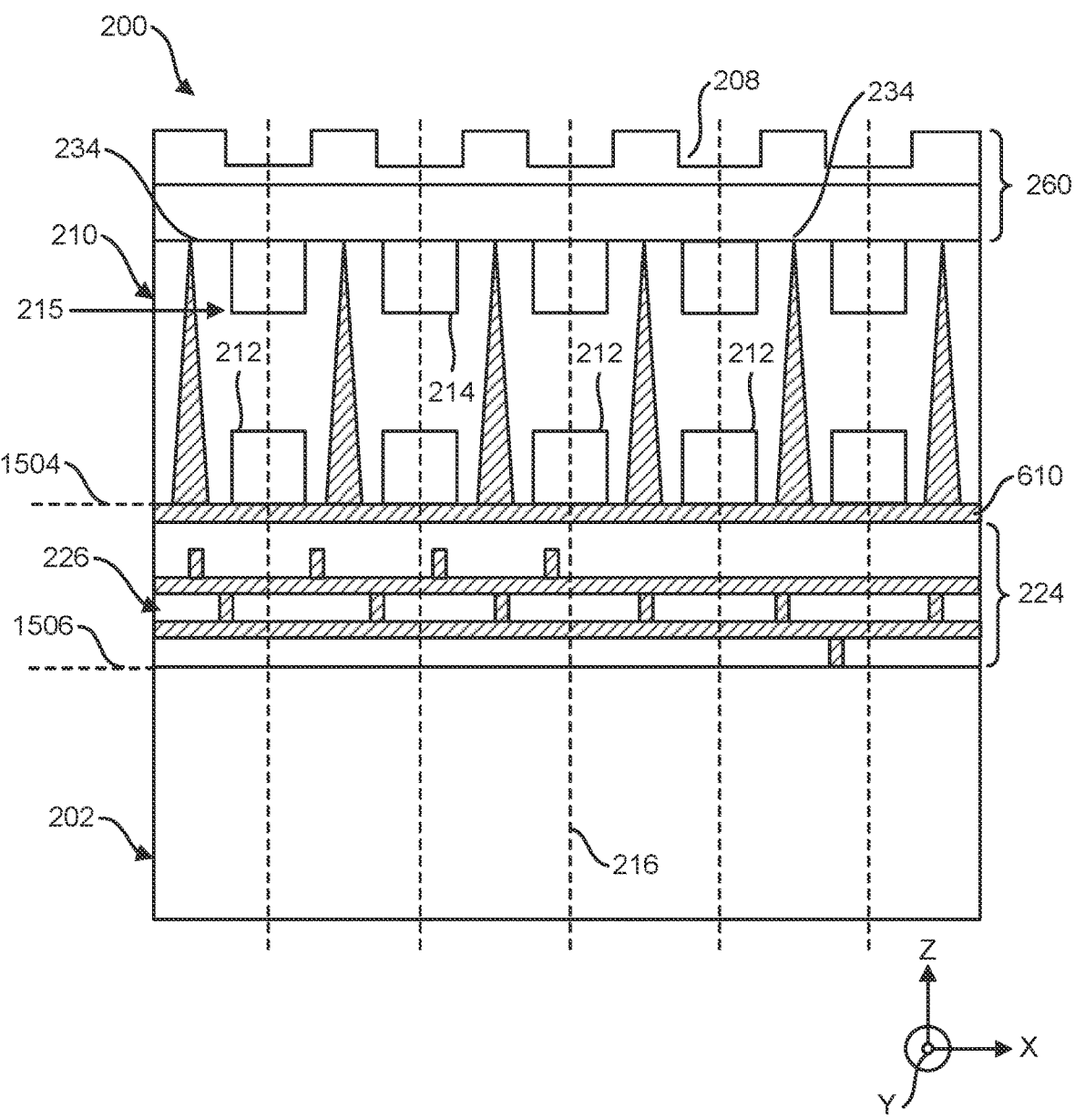
FIG. 12 is a schematic cutaway side view of a detector for use in biological or chemical analysis having a detector that includes a detector surface for supporting a biological or chemical sample according to one example.

In some examples, semiconductor formation 210 and dielectric stack 224 that can integrate the one or more metallization layer 226 defining the described circuitry can be fabricated, respectively, on first and second different wafers using the described first and second wafers. Subsequent to fabrication on different respective wafers, semiconductor formation 210 and dielectric stack 224 can be bonded together using wafer scale bonding. FIGS. 11 through 12 illustrate examples of detector 200 wherein semiconductor formation 210 and dielectric stack 224 are bonded together using wafer scale bonding. As shown by the examples of FIG. 11 and FIG. 12, detector 200 can include bond layer 610 resulting from wafer scale bonding of a first wafer having semiconductor formation 210 to a second wafer having dielectric stack 224. In one example, wafer scale bonding herein can include fusion bonding. In one example, wafter scale bonding herein can include low temperature oxide fusion bonding. Referring to FIG. 12, FIG. 12 illustrates detector 200 according to an example wherein filters 234 are deleted.

Fabrication methods herein refer to "frontside" and "backside" in reference to semiconductor formation 210. In one example, a "frontside" of semiconductor formation 210 can refer to a first side of semiconductor formation 210 that is subject to layer deposition for fabrication of a dielectric stack on the semiconductor formation 210.

According to one example, detector 200 can be provided by a solid-state integrated circuit detector, such as complementary metal oxide semiconductor (CMOS) integrated circuit detector or a charge coupled device (CCD) integrated circuit detector. Doped areas 212 defining sensing photodiodes, in one example, can be provided in a two-dimensional array of sensing photodiodes having rows and columns of sensing photodiodes arranged in a two dimensional grid pattern that is shown in the cross-sectional top view of FIG. 13 taken along the elevation of doped areas 212. In one example, such sensing photodiodes can include at least about 1M sensing photodiodes, or can include fewer sensing photodiodes. The doped areas 212 defining sensing photodiodes can be disposed in a two dimensional grid of pixel positions. The doped areas 212 of FIG. 2 defining sensing photodiodes have respective pixel positions A1-F4.

Referring to FIG. 1, reaction sites defining reaction recesses 208 (nanowells) can alternatively be defined by alternative features. The alternative features can comprise, e.g., structural feature variations and/or variations in chemical composition. Structural features defining structural feature variations can form an array in or on sample supporting structure 260. Exemplary structural features can include, but are not limited to, nanowells as set forth herein, posts, pads, ridges, channels, and/or layers of a multilayer material. A feature can have characteristics such as size (e.g., volume, diameter, and depth), shape (e.g., round, elliptical, triangular, square, polygonal, star shaped (having any suitable number of vertices), irregular, or having concentric features separated by a dielectric material), and distribution (e.g., spatial locations of the features within the dielectric material, e.g., regularly spaced or periodic locations, or irregularly spaced or aperiodic locations). The cross section of a feature can be, but need not necessarily be, uniform along the length of the feature.

In one aspect, each respective doped area 212 of detector 200 defining a sensing photodiode can have associated and aligned thereto one or more reaction site. In one example of being aligned, a reaction site aligned to a doped area 212 can be disposed within a boundary delimited by a pair of adjacent width dimension vertically extending planes 2201 and a pair of adjacent depth dimension vertically extending planes 2202 as depicted in FIG. 13. The array of sensing photodiodes defined by doped areas 212 which doped areas 212 can be disposed within an area delimited by adjacent width dimension vertically extending planes 2201 and adjacent depth dimension vertically extending planes 2202 can define pixel positions A1-F4 depicted in FIG. 13. In one example of a reaction site and a doped area being associated and aligned, a vertically extending central axis of a reaction site can extend through an associated doped area, and/or a vertically extending central axis of a doped area can extend through a reaction site. A reaction site and a doped region that are associated to one another and aligned can also be associated to and aligned with a certain doped region of doped regions 214. In one example of a doped area, doped region and a reaction site that are associated to one another and aligned, a vertically extending central axis of a certain doped area can extend through a certain doped region and a certain reaction site, and/or a vertically extending central axis of a certain doped region 214 can extend through a certain doped area 212 and a certain reaction site. In one particular example, as set forth throughout several of the views, respective sets of doped areas 212, doped regions 214 and reaction sites, e.g., provided by reaction recesses 208 (nanowell) can share common respective vertically extending central axes 216. In another example of being aligned, a doped region 214 aligned and associated to a doped area 212 and/or a certain reaction site, e.g., provided by a reaction recess 208, can be disposed within a boundary delimited by a pair of adjacent width dimension vertically extending planes 2201 and a pair of adjacent depth dimension vertically extending planes 2202 as depicted in FIG. 13.

Each respective doped area 212 defining a sensing photodiode can have a pixel position, $P_X$, $P_Y$ which can be referenced as an X dimension position in combination with a Y dimension position, e.g., the pixel positions A1-F4 as depicted in FIG. 13. Sample supporting structure 260, likewise, can be divided into pixel positions, wherein respective pixel positions of sample supporting structure 260 (FIG. 1) map to respective pixel positions of the array of sensing photodiodes defined by doped areas 212. Like the pixel positions of the defined array of sensing photodiodes defined by doped areas 212, the pixel positions of sample supporting structure 260 can be delimited by adjacent width dimension vertically extending planes 2201 and adjacent depth dimension vertically extending planes 2202. The depicted pixel positions serve as pixel positions for reaction sites associated to respective doped areas 212, e.g., provided by reaction recesses 208 or alternate features formed on sample supporting structure 260 (FIG. 1). The depicted pixel positions also serve as pixel positions for doped regions 214 associated to respective doped areas 212 which can be associated to and aligned to a respective doped area 212 and/or a respective reaction sites, e.g., reaction recesses 208.

Referring to FIG. 1 and FIG. 13, it will be seen that a portion of sample supporting structure 260 (support structure) having the pixel position $P_{X=m}$, $P_{Y=n}$ can include a reaction site provided by reaction recess 208 that is disposed over and on, and which is aligned to a certain doped area 212 of the defined pixel array having the common pixel position $P_{X=m}$, $P_{Y=n}$. In the view of FIG. 13 in dashed view, there is shown a reaction recess 208 disposed at each respective pixel position of pixel positions A1-F4, wherein one pixel position is defined for each respective doped area 212 defining a sensing photodiode. In some examples, more than one reaction site can be associated to each doped area 212 and each pixel position. In the view of FIG. 13 in dashed form (to indicate its presence in the foreground), there is shown a doped region 214 which is representative of a doped region 214 which can be disposed at each respective pixel position of pixel positions A1-F4, wherein one pixel position is associated to each respective doped region 214.

In reference again to FIG. 1, system 100 can include processing circuitry 310. Processing circuitry 310 can include, according to one example, one or more processors 3101, memory 3102, and one or more input/output interface 3103. One or more processors 3101, memory 3102 and one or more input/output interface can be connected via system bus 3104. Memory 3102 can include a combination of system memory and storage memory. Memory 3102, according to one example, can store one or more programs for facilitating processes that are set forth herein. One or more processors 3101 can run one or more programs stored in memory 3102 to facilitate processes as is set forth herein. Memory 3102 can define a computer readable medium.

Figure 14:
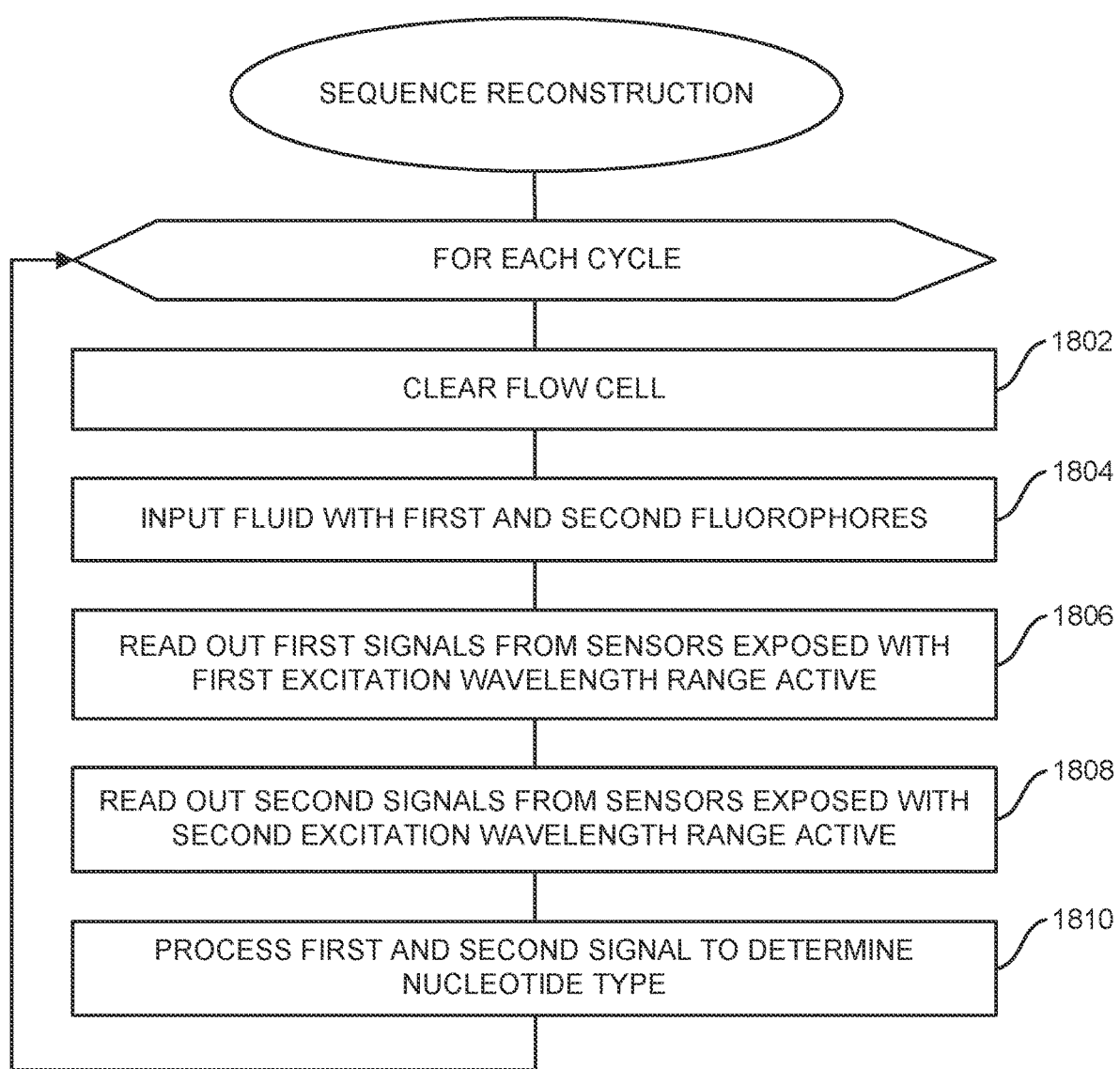
FIG. 14 is a flowchart depicting a method for performance of sequencing.

A DNA sequencing process facilitated by light energy exciter 10 is described with reference to FIGS. 1, 2 and 14. Referring to FIG. 2, there is shown a spectral profile coordination diagram illustrating aspects of the operation of system 100. According to one example, light energy exciter 10 can be configured to radiate excitation light at first and second different wavelengths. As set forth herein, providing excitation light 101 at first and second different wavelength ranges facilitates dye chemistry DNA sequence reconstruction processes in which first and second dyes can be disposed in fluid within flow cell 282.

In the spectral profile coordination diagram of FIG. 2, spectral profile 1101 shown as a green light spectral profile is the spectral profile of excitation light 101 as emitted by light energy exciter 10. Spectral profile 1501 is the spectral second fluorophore is attached to a sample 502 based on fluorescence being sensed by a doped area 212 defined by sensing photodiode under excitation restricted to excitation by one or more blue emitting light sources and fluorescence not being sensed by the doped area 212 defined by sensing photodiode under excitation restricted to excitation by one or more green emitting light sources; and (c) determine that the third fluorophore is attached to a sample 502 based on fluorescence being sensed by a doped area 212 defined by sensing photodiode under excitation restricted to excitation by one or more green emitting light sources and fluorescence also being sensed by the doped area 212 defined by sensing photodiode under excitation restricted to excitation by one or more blue emitting light sources. Processing circuitry 310 can discriminate which fluorophores have attached to samples, and can determine nucleotide types, e.g. A, C, T, and G that are present in a fragment of a DNA strand providing a sample 502, e.g., using a decision logic data structure indicated by the decision logic table of Table 1 mapping fluorophore presence to nucleotide type, where discriminated nucleotides Nucleotide-Nucleotide4 are nucleotides of the nucleotide types A, C, T and G (the particular mapping based on the test setup parameters).

TABLE 1

| Detected fluorescence under excitation restricted to excitation by one or more green emitting light sources | Detected fluorescence under excitation restricted to excitation by one or more blue emitting light sources | Fluorophore presence indicated | Nucleotide indicated |
|---|---|---|---|
| YES | NO | first Fluorophore | Nucleotide 1 |
| NO | YES | second Fluorophore | Nucleotide2 |
| YES | YES | third Fluorophore | Nucleotide3 |
| NO | NO | — | Nucleotide4 | profile of the emission light 501 caused by the fluorescence of a fluorophore on being excited by excitation light 101. Spectral profile 1220 is the transmission profile (detection band) of doped areas 212, according to one example. It will be understood that the spectral profile coordination diagram of FIG. 2 is intended to represent general features common to some examples, but that variations of the indicated spectral profiles are common.

In one aspect, excitation light 101 can commonly include, in addition to a green light spectral profile, a blue light spectral profile (not shown) wherein system 100 is switchable between modes in which (a) the green light spectral profile is active with the blue light spectral profile being inactive, and (b) the blue light spectral profile is active with the green light spectral profile being inactive. In other examples, there can be different combinations of excitation light 101 and emission light 501. In one example, the spectral profile 1101 of excitation light 101 can feature a center wavelength in the blue light wavelength range and the spectral profile of emission light 501 can feature a center wavelength in the green wavelength range.

Examples herein recognize in reference to the spectral profile coordination diagram of FIG. 2 that processing circuitry 310 can be configured to (a) determine that the first fluorophore is attached to a sample 502 (FIG. 1) based on fluorescence being sensed by a doped area 212 defined by sensing photodiode under excitation restricted to excitation by one or more green emitting light sources and fluorescence not being sensed by the doped area 212 defined by sensing photodiode under excitation restricted to excitation by one or more blue emitting light source; (b) determine that the Processing circuitry 310 can run a process in support of DNA sequence reconstruction in a plurality of cycles. In each cycle, a different portion of a DNA fragment can be subject to sequencing processing to determine a nucleotide type, e.g. A, C, T, or G, associated to the fragment, e.g., using a decision data structure such as a decision data structure as set forth in Table 1. Aspects of a process which can be run by processing circuitry 310 for use in performing DNA sequence reconstruction using light energy exciter 10 is described in the flowchart of FIG. 20.

At block 1802 processing circuitry 310 can clear flow cell 282, meaning processing circuitry 310 can remove fluid from flow cell 282 used during a prior cycle. At block 1804, processing circuitry 310 can input into flow cell 282 fluid having multiple fluorophores, e.g., first and second fluorophores, or first, second and third fluorophores.

At block 1806, processing circuitry 310 can read out signals from doped areas 212 exposed with a first wavelength range excitation active. At block 1806, processing circuitry 310 can control light energy exciter 10 so that during an exposure period of doped areas 212 light energy exciter 10 emits excitation light restricted excitation by one or more green light sources. At block 1806, processing circuitry 310 can during an exposure period of doped areas 212 energize each one or more green emitting light sources of light energy exciter 10, while maintaining in a deenergized state each one or more blue emitting light sources of light energy exciter 10. With the light energy exciter 10 being controlled as described so that green light sources are on and blue light sources are off during an exposure period of doped areas 212, processing circuitry 310 at block 1806 can read out first signals from doped areas 212 exposed with excitation restricted to excitation by one or more green light sources as set forth herein.

At block 1808, processing circuitry 310 can read out signals from doped areas 212 exposed with a second wavelength range excitation active. At block 1808, processing circuitry 310 can control light energy exciter 10 so that during an exposure period of the array of sensing photodiodes defined by doped areas 212 light energy exciter 10 emits excitation light restricted to excitation by one or more blue light sources of light energy exciter 10. At block 1808, processing circuitry 310 can during an exposure period of an array of sensing photodiodes defined by doped areas 212 energize each of one or more blue emitting light sources of light energy exciter 10, while maintaining in a deenergized state each one or more green emitting light sources of light energy exciter 10. With the light energy exciter 10 being controlled as described so that blue light sources are on and green light sources are off during an exposure period of doped areas 212, processing circuitry 310 at block 1808 can read out second signals from doped areas 212 exposed with excitation restricted to excitation by one or more blue light sources as set forth herein. In each of the described exposure periods of the array of sensing photodiodes defined by doped areas 212 (array of doped areas 212) according to one example, light energy exciter 10 can commonly and simultaneously radiate with excitation light 101 each reaction site, e.g., each reaction recess 208 of detector 200.

At block 1810 processing circuitry 310 for the current cycle can process the first signals read out at block 1806 and the second signals read out at block 1808 to determine a nucleotide type of the DNA fragment being subject to testing during the current cycle, e.g., using a decision data structure as set forth in Table 2 according to one example. Processing circuitry 310 can perform the described nucleotide identification process described with reference to the flowchart of FIG. 14 for each cycle of the DNA sequencing process until nucleotide identification is performed for each scheduled cycle.

Processing circuitry 310 can be configured to perform a wide range of tests for testing operation of the system 100. Processing circuitry 310 can perform a calibration test in which operation of light energy exciter 10 and detector 200 is tested. In such an example processing circuitry 310 can be configured to selectively energize different light sources during exposure periods of the array of sensing photodiodes defined by doped areas 212 (array of doped areas 212) and can examine signals read out of pixel array of sensing photodiodes during the exposure periods. A method can include selectively energizing a first light source (e.g. green emitting) during a first exposure period of the array of sensing photodiodes with second (blue emitting) and third (e.g. red emitting) light sources maintained in a deenergized state, selectively energizing the second light source during a second exposure period of the array of sensing photodiodes with the first and third light sources maintained in a deenergized state, and selectively energizing the third light source during a third exposure period of the array of sensing photodiodes with the first and second light sources maintained in a deenergized state.

There is set forth herein, with reference to various of the views a support structure 260 defining a detector surface 206 configured for supporting biological or chemical samples; a plurality of spaced apart doped areas 212 formed in a semiconductor formation 210, wherein the semiconductor formation 210 receives excitation light 101 and emission light 510 from the detector surface 206, the plurality of spaced apart doped areas 212 defining photodiodes; a plurality of spaced apart doped regions 214 formed in the semiconductor formation 210, wherein respective ones of the plurality of spaced apart doped regions 214 are associated to respective ones of the doped areas 212, and wherein the respective ones of the doped regions 214 are disposed in a receive light path of the excitation light 101 and emission light 501 intermediate the detector surface 206 and the respective ones of the doped areas 212; and wherein respective doped regions 214 of the plurality of spaced apart doped regions 214 formed in the semiconductor formation 210 produce respective electric fields that impact a travel direction of electrons generated in the respective doped regions 214 as a result of photons of the excitation light 101 and emission light 501 being absorbed in the respective doped regions 214, wherein the respective doped regions 214 define a light entry surface of the semiconductor formation 210, wherein the respective doped regions 214 have a junction depth greater than an absorption depth of a center wavelength of the excitation light 101, and wherein the junction depth of the respective doped regions 214 is less than an absorption depth of a center wavelength of the emission light 501, wherein the plurality spaced apart doped areas 212 and the plurality of spaced apart doped regions 214 are separated by a vertical spacing distance, wherein the plurality spaced apart doped areas 212 have a common top elevation (elevation 2148, FIG. 4) and the plurality of spaced apart doped regions 214 have a common bottom elevation (elevation 2146, FIG. 4), and wherein the semiconductor formation 210 is undoped between the common top elevation of plurality spaced apart doped areas and the common bottom elevation of the plurality of spaced apart doped regions, wherein respective ones of the plurality of spaced apart doped regions 214 are aligned to respective ones of the doped areas 212, and wherein alignment of respective ones of the plurality of spaced apart doped regions to respective ones of the doped areas is characterized by vertically extending central axes 216 of respective ones of the doped areas 212 extending through respective ones of the doped regions 214, wherein the device includes sample supporting reaction sites (e.g., reaction recesses 208) formed on the support structure 260 defining the detector surface 206 associated to respective ones of the plurality of spaced part dopes areas 212, and a light energy exciter 10 for illuminating sites of the reactions sites, wherein the device is controlled so that the light energy exciter 10 directs excitation light 101 toward a plurality of adjacent ones of the reaction sites simultaneously for simultaneous excitation of samples supported respectively by the plurality of adjacent ones of the sample supporting reaction sites.

Further details of system 100 according to one example are set forth in reference to Table 2.

TABLE 2

| Structure | Material and Process Conditions |
|---|---|
| Semiconductor formation 210 | Semiconductor formation 210 can be formed by grinding and then planarizing a bulk silicon wafer to thickness of from about 1.0 um to about 45.0 um. Alternatively, semiconductor formation 210 can be formed by grinding a silicon layer of an SOI wafer to a thickness of from about 1.0 um to about 45.0 um. |

TABLE 2-continued

| Structure | Material and Process Conditions |
| --- | --- |
| Doped areas 212 | Doped areas 212 defining sensing photodiodes can be provided as n-doped regions on a p-substrate, or it could be an n-doped region on a p-well on an n-doped substrate or any other diode combination. Depth of the junction can be, e.g., from about 0.2 um to about 2.0 um according to one example. Doped areas 212 defining sensing photodiodes in one example can have a diameter, e.g., of about 1.0 um or less. Doped areas 212 defining sensing photodiodes in one example can have a diameter, e.g., of less than about 1.0 um. Doped areas 212 defining sensing photodiodes in one example can have a diameter, e.g., of less than 1.0 um. |
| Doped regions 214 | Doped regions 214 can have a thickness of from about 1.0 um to about 20 um, according to one example, and from about 0.2 um to about 20 um, according to another example. Junction depth can be tuned according to the wavelength targeted for separation. Doped regions 214 can be provided as n-doped regions on a p-substrate, or it could be an n-doped region on a p-well on an n-doped substrate or any other diode combination. |
| Deep trench isolation (DTI) formations 218 | DTI formations 218 can be formed of dielectric material, e.g., silicon nitride (SiN), silicon oxide (SiO2), hafnium oxide (HfO2), or TaO5 (Ta205). DTI formations 218 can feature diameters of from about 0.1 to about 0.3 um. DTI formations 218 can have aspect ratios, e.g., of from about 1:5 to about 1:25. Height can be from about 1.0 um to about 15 um. |
| Sample supporting structure 260 | Structure 260 can comprise multiple dielectrics, e.g., silicon nitride (SiN), silicon oxide (SiO2), hafnium oxide (HfO2), or TaO5 (Ta2O5). |
| Filters 234 | Filters can be formed of appropriate filter material, e.g., a dye suspended in a polymer matrix. With the providing of doped regions 214, the thickness of filters 234 can be reduced, e.g., to about 5 um, or less, and in one example to about 2 um or less, and in one example to about 1 um or less. |
| Substrate 202 | Can comprise a thickness, e.g., of from about 400 um to about 800 um to mechanically support semiconductor formation 210 and remaining structures fabricated thereon. |

A small sample of combinations set forth herein include the following: (A1) A device comprising: a detector surface comprising reaction sites for supporting biological or chemical samples; a plurality of spaced apart doped areas formed in a semiconductor formation, wherein the semiconductor formation receives excitation light and emission light from the detector surface, the plurality of spaced apart doped areas defining photodiodes; a plurality of spaced apart doped regions formed in the semiconductor formation, wherein respective ones of the plurality of spaced apart doped regions are associated to respective ones of the doped areas, and wherein the respective ones of the doped regions are disposed in a receive light path of the excitation light and emission light intermediate the detector surface and the respective ones of the doped areas; and wherein respective doped regions of the plurality of spaced apart doped regions formed in the semiconductor formation produce respective electric fields that impact a travel direction of electrons generated in the respective doped regions as a result of photons of the excitation light being absorbed in the respective doped regions. (A2) The device of A1, wherein the respective doped regions have a junction depth greater than an absorption depth of a center wavelength of the excitation light. (A3) The device of any of A1 through A2, wherein the respective doped regions have a junction depth less than an absorption depth of a center wavelength of the emission light. (A4) The device of any of A1 through A3, wherein the respective doped regions define a light entry surface of the semiconductor formation. (A5) The device of any of A1 through A4, wherein the respective doped regions have a junction depth greater than an absorption depth of a center wavelength of the excitation light, and wherein the junction depth of the respective doped regions is less than an absorption depth of a center wavelength of the emission light. (A6) The device of any of A1 through A5, wherein a junction depth of respective junctions defined by the respective doped regions is configured so that a percentage of photons at a center wavelength of the emission light absorbed at elevations of the semiconductor formation below the respective junctions is about 2× or more than a percentage of photons at a center wavelength of the excitation light absorbed at elevations of the semiconductor formation below the respective junctions. (A7) The device of any of A1 through A6, wherein a junction depth of respective junctions defined by the respective doped regions is configured so that a percentage of photons at a center wavelength of the emission light absorbed at elevations of the semiconductor formation below the respective junctions is about 20× or more than a percentage of photons at a center wavelength of the excitation light absorbed at elevations of the semiconductor formation below the respective junctions. (A8) The device of any of A1 through A7, wherein a junction depth of respective junctions defined by the respective doped regions is configured so that a percentage of photons at a center wavelength of the emission light absorbed at elevations of the semiconductor formation below the respective junctions is about 50× or more than a percentage of photons at a center wavelength of the excitation light absorbed at elevations of the semiconductor formation below the respective junctions. (A9) The device of any of A1 through A8, wherein the respective doped regions are configured to cause drift of electrons generated in the respective doped regions as a result of photons of the excitation light and emission light being absorbed in the respective doped regions. (A10) The device of any of A1 through A9, wherein the respective doped regions are configured to cause drift of electrons generated in the respective doped regions as a result of photons of the excitation light and emission light being absorbed in the respective doped regions in a direction toward a light entry surface of the semiconductor formation. (A11) The device of any of A1 through A10, wherein the respective doped regions are dimensioned to feature a junction depth longer than an absorption depth of light in the blue wavelength band, the depth being shorter than an absorption depth of light in the red wavelength band. (A12) The device of any of A1 through A11, wherein the respective doped regions are dimensioned to feature a junction depth longer than an absorption depth of light in the green wavelength band, the depth being shorter than an absorption depth of light in the red wavelength band. (A13) The device of any of A1 through A12, wherein the respective doped regions are dimensioned so that an absorption depth of photons of the excitation light of a first wavelength is less than a junction depth of the respective doped regions. (A14) The device of any of A1 through A13, wherein the respective doped regions comprise a first set of respective doped regions having a first junction depth, and a second set of respective doped regions having a second junction depth, the second junction depth being less than the first junction depth. (A15) The device of any of A1 through A14, wherein the respective doped regions comprise a first set of respective doped regions having a first junction depth and being configured for wavelength separation of light in the green wavelength band, and a second set of respective doped regions having a second junction depth, the second junction depth being less than the first junction depth and being configured for wavelength separation of light in the blue wavelength band. (A16) The device of any of A1 through A15, wherein the semiconductor formation comprises vertically extending deep trench isolation formations separating the respective doped regions, wherein a doped region of the plurality of spaced apart doped regions laterally contacts first and second ones of the vertically extending deep trench isolation formations. (A17) The device of any of A1 through A16, wherein respective ones of the plurality of spaced apart doped regions are aligned to respective ones of the doped areas. (A18) The device of any of A1 through A17, wherein respective ones of the plurality of spaced apart doped regions are aligned to respective ones of the doped areas, and wherein alignment of respective ones of the plurality of spaced apart doped regions to respective ones of the doped areas is characterized by vertically extending central axes of respective ones of the doped areas extending through respective ones of the doped regions. (A19) The device of any of A1 through A18, wherein the plurality spaced apart doped areas and the plurality of spaced apart doped regions are separated by a vertical spacing distance, wherein the plurality spaced apart doped areas have a common top elevation and the plurality of spaced apart doped regions have a common bottom elevation, and wherein the semiconductor formation is undoped between the common top elevation of the plurality spaced apart doped areas and the common bottom elevation of the plurality of spaced apart doped regions. (A20) The device of any of A1 through A19, wherein respective ones of the reaction sites are associated to respective ones of the plurality of spaced apart doped areas, and wherein the device includes a light energy exciter for illuminating sites of the reaction sites. (A21) The device of any of A1 through A20, wherein the device includes a support structure defining the detector surface, wherein respective ones of the reaction sites are associated to respective ones of the plurality of spaced apart doped areas, wherein the device includes a light energy exciter for illuminating sites of the reactions sites, and wherein the device is controlled so that the light energy exciter directs excitation light toward a plurality of adjacent ones of the reaction sites simultaneously for simultaneous excitation of samples supported respectively by the plurality of adjacent ones of the reaction sites. (A22) The device of any of A1 through A21, wherein respective ones of the reaction sites are associated to respective ones of the plurality of spaced apart doped areas, wherein the device includes a light energy exciter for illuminating sites of the reactions sites, wherein the device is controlled so that the light energy exciter directs excitation light toward substantially all reaction sites of the detector surface simultaneously for simultaneous excitation of samples supported respectively by the substantially all reaction sites of the detector surface. (A23) The device of any of A1 through A22, wherein respective ones of the plurality of spaced apart doped regions are aligned to respective ones of the doped areas, and wherein alignment of respective ones of the plurality of spaced apart doped regions to respective ones of the doped areas is characterized by vertically extending central axes of respective ones of the doped areas extending through respective ones of the doped regions. (A24) The device of A1, wherein the respective doped regions have a junction depth greater than an absorption depth of a center wavelength of the excitation light, and wherein the junction depth of the respective doped regions is less than an absorption depth of a center wavelength of the emission light. (A25) The device of A1, wherein a junction depth of respective junctions defined by the respective doped regions is configured so that a percentage of photons at a center wavelength of the emission light absorbed at elevations of the semiconductor formation below the respective junctions is about 20× or more than a percentage of photons at a center wavelength of the excitation light absorbed at elevations of the semiconductor formation below the respective junctions. (A26) The device of A1, wherein the respective doped regions are configured to cause drift of electrons generated in the respective doped regions as a result of photons of the excitation light and emission light being absorbed in the respective doped regions. (A27) The device of A1, wherein the respective doped regions are configured to cause drift of electrons generated in the respective doped regions as a result of photons of the excitation light and emission light being absorbed in the respective doped regions in a direction toward a light entry surface of the semiconductor formation. (A28) The device of A1, wherein the respective doped regions comprise a first set of respective doped regions having a first junction depth, and a second set of respective doped regions having a second junction depth, the second junction depth being less than the first junction depth. (A29) The device of A1, wherein respective ones of the reaction sites are associated to respective ones of the plurality of spaced apart doped areas, wherein the device includes a light energy exciter for illuminating sites of the reactions sites, wherein the device is controlled so that the light energy exciter directs excitation light toward a plurality of adjacent ones of the reaction sites simultaneously for simultaneous excitation of samples supported respectively by the plurality of adjacent ones of the reaction sites. (A30) The device of A1, wherein the respective doped regions define a light entry surface of the semiconductor formation, wherein the respective doped regions have a junction depth greater than an absorption depth of a center wavelength of the excitation light, and wherein the junction depth of the respective doped regions is less than an absorption depth of a center wavelength of the emission light, wherein the plurality spaced apart doped areas and the plurality of spaced apart doped regions are separated by a vertical spacing distance, wherein the plurality spaced apart doped areas have a common top elevation and the plurality of spaced apart doped regions have a common bottom elevation, and wherein the semiconductor formation is undoped between the common top elevation of plurality spaced apart doped areas and the common bottom elevation of the plurality of spaced apart doped regions, wherein respective ones of the plurality of spaced apart doped regions are aligned to respective ones of the doped areas, and wherein alignment of respective ones of the plurality of spaced apart doped regions to respective ones of the doped areas is characterized by vertically extending central axes of respective ones of the doped areas extending through respective ones of the doped regions, wherein respective ones of the reaction sites of the detector surface are associated to respective ones of the plurality of spaced part dopes areas, wherein the device includes a light energy exciter for illuminating sites of the reactions sites, wherein the device is controlled so that the light energy exciter directs excitation light toward a plurality of adjacent ones of the reaction sites simultaneously for simultaneous excitation of samples supported respectively by the plurality of adjacent ones of the reaction sites. (B1) A device comprising: a detector surface for supporting biological or chemical samples; an array of doped areas formed in a semiconductor formation, wherein the semiconductor formation receives excitation light and emission light from the detector surface, and wherein doped areas of the array of doped areas define photodiodes; a doped region formed in the semiconductor formation in a receive light path of the excitation light and emission light intermediate the detector surface and a doped area of the array of doped areas; and wherein the doped region is configured to impact a travel direction of electrons generated in the doped region as a result of photon absorption. (B2) The device of B1, comprising an array of doped regions formed in the semiconductor formation, wherein the array of doped regions comprises the doped region, and wherein respective ones of doped regions defining the array of doped regions are respectively associated to one doped area of the array of doped areas. (B3) The device of B1, comprising an array of doped regions formed in the semiconductor formation, wherein the array of doped regions comprises the doped region, and wherein respective ones of doped regions defining the array of doped regions are respectively associated to one doped area of the array of doped areas, and wherein the respective ones of doped regions defining the array of doped regions are respectively disposed in the receive light path of the excitation light and emission light intermediate the detector surface and one doped area of the array of doped areas. (B4) The device of any of B1 through B3, wherein the doped region produces an electric field that impacts a travel direction of electrons generated in the doped region as a result of photon absorption. (B5) The device of any of B1 through B4, wherein the doped region is configured to cause drift of electrons generated in the doped region as a result of photons of the excitation light being absorbed in the doped region. (B6) The device of any of B1 through B5, wherein the doped region is configured to cause drift of electrons generated in the doped region as a result of photons of the excitation light and emission light being absorbed in the respective doped region in a direction toward a light entry surface of the semiconductor formation. (B7) The device of any of B1 through B6, wherein the doped region has a junction depth longer than an absorption depth of the longest wavelength in the blue wavelength band, the depth being shorter than an absorption depth of the longest wavelength in the red wavelength band. (B8) The device of any of B1 through B7, wherein the doped region is dimensioned to feature a depth longer than an absorption depth of the longest wavelength in the green wavelength band, the depth being shorter than an absorption depth of the longest wavelength in the red wavelength band. (B9) The device of any of B1 through B8, wherein the doped region has a junction depth less than an absorption depth of a center wavelength of the emission light. (B10) The device of any of B1 through B9, wherein the doped region has a junction depth greater than an absorption depth of a center wavelength of the excitation light, and wherein the doped region is configured to have a junction depth less than an absorption depth of a center wavelength of the emission light. (B11) The device of any of B1 through B10, wherein a junction depth of the doped region is configured so that a percentage of photons at a center wavelength of the emission light absorbed at elevations of the semiconductor formation below the junction is about 2× or more than a percentage of photons at a center wavelength of the excitation light absorbed at elevations of the semiconductor formation below the junction. (B12) The device of any of B1 through B11, wherein a junction depth of the doped region is configured so that a percentage of photons at a center wavelength of the emission light absorbed at elevations of the semiconductor formation below the junction is about 20× or more than a percentage of photons at a center wavelength of the excitation light absorbed at elevations of the semiconductor formation below the junction. (B13) The device of any of B1 through B12, wherein a junction depth of the doped region is configured so that a percentage of photons at a center wavelength of the emission light absorbed at elevations of the semiconductor formation below the junction is about 50× or more than a percentage of photons at a center wavelength of the excitation light absorbed at elevations of the semiconductor formation below the junction. (B14) The device of any of B1 through B3, wherein the doped region is configured to cause drift of electrons generated in the doped region as a result of photons of the excitation light being absorbed in the doped region. (B15) The device of any of B1 through B3, wherein the doped region is configured to cause drift of electrons generated in the doped region as a result of photons of the excitation light and emission light being absorbed in the respective doped region in a direction toward a light entry surface of the semiconductor formation. (B16) The device of any of B1 through B3, wherein the doped region has a junction depth longer than an absorption depth of the longest wavelength in the blue wavelength band, the depth being shorter than an absorption depth of the longest wavelength in the red wavelength band. (B17) The device of any of B1 through B3, wherein the doped region is dimensioned to feature a depth longer than an absorption depth of the longest wavelength in the green wavelength band, the depth being shorter than an absorption depth of the longest wavelength in the red wavelength band. (B18) The device of any of B1 through B3, wherein the doped region has a junction depth less than an absorption depth of a center wavelength of the emission light. (B19) The device of any of B1 through B3, wherein the doped region has a junction depth greater than an absorption depth of a center wavelength of the excitation light, and wherein the doped region is configured to have a junction depth less than an absorption depth of a center wavelength of the emission light. (B20) The device of any of B1 through B3, wherein a junction depth of the doped region is configured so that a percentage of photons at a center wavelength of the emission light absorbed at elevations of the semiconductor formation below the junction is about 20× or more than a percentage of photons at a center wavelength of the excitation light absorbed at elevations of the semiconductor formation below the junction. (B21) The device of any of B1 through B3, wherein a junction depth of the doped region is configured so that a percentage of photons at a center wavelength of the emission light absorbed at elevations of the semiconductor formation below the junction is about 50× or more than a percentage of photons at a center wavelength of the excitation light absorbed at elevations of the semiconductor formation below the junction. (C1) A method comprising: forming in a semiconductor formation an array of doped areas; forming in the semiconductor formation an array of doped regions, wherein respective doped regions of the array of doped regions are associated to respective doped areas of the array of doped areas; and forming a detector surface, wherein the semiconductor formation is configured to receive excitation light and emission light from the detector surface; wherein the respective doped regions are formed in the semiconductor formation in a receive light path of the excitation light and emission light from the detector surface. (C2) The method of C1, wherein the respective doped regions are configured to impact a travel direction of electrons generated therein as a result of photon absorption. (C3) The method of any of C1 through C2, wherein the method comprises fabricating above the semiconductor formation, using frontside processing, one or more filter between the semiconductor formation and the array of doped areas, the one or more filter blocking illumination of the excitation light and permitting light of the emission light to reach the array of doped areas. (C4) The method of any of C1 through C3, wherein the method comprises fabricating above the semiconductor formation, using backside processing, one or more filter between the semiconductor formation and the array of doped areas, the one or more filter blocking illumination of the excitation light and permitting light of the emission light to reach the array of doped areas. (C5) The method of any of C1 through C4, wherein the method comprises etching, from a frontside to a backside of the semiconductor formation, a plurality of trenches, and filling the plurality of trenches with dielectric material to define vertically extending deep trench isolation (DTI) formations in the semiconductor formation that extend vertically between respective ones of the doped areas. (C6) The method of any of C1 through C5, wherein the method comprises etching, from a backside to a frontside of the semiconductor formation, a plurality of trenches, and filling the plurality of trenches with dielectric material to define vertically extending deep trench isolation (DTI) formations in the semiconductor formation that extend vertically between respective ones of the doped areas of the array of doped areas. (C7) The method of any of C1 through C6, wherein the method comprises fabricating vertically extending deep trench isolation (DTI) formations in the semiconductor formation that extend vertically between respective ones of the doped areas of the array of doped areas, and wherein the forming in the semiconductor formation an array of doped regions comprises forming respective ones of the doped regions so that respective ones of the doped regions laterally contact first and second of the DTI formations. (C8) The method of any of C1 through C7, wherein the forming in the semiconductor formation an array of doped regions comprises forming a laterally extended doped region that laterally extends to oppose a plurality of doped areas of the array of doped areas such that respective central axes of doped regions defining the array of doped regions commonly extend through the laterally extended doped region, etching the laterally extended doped region to define trenches, and filling the trenches with dielectric material to define DTI formations that separate the laterally extended doped region into respective ones of the doped regions defining the array of doped regions. (C9) The method of any of C1 through C8, wherein the method includes depositing a dielectric stack on the semiconductor formation, the dielectric stack integrating a metallization layer defining circuitry for readout of signals from the array of doped areas. (C10) The method of any of C1 through C9, wherein the method includes depositing a dielectric stack on the semiconductor formation, the dielectric stack integrating a metallization layer defining circuitry for readout of signals from the array of doped areas, wherein for expansion of a thermal budget associated to a formation of the doped regions the method employs wafer flipping to facilitate the formation of the doped regions prior to the depositing of the dielectric stack. (C11) The method of any of C1 through C10, wherein the method includes depositing a dielectric stack on a second wafer separate from a wafer defining the semiconductor formation, the dielectric stack integrating a metallization layer defining circuitry for readout of signals from the array of doped areas, wherein for expansion of a thermal budget associated to a formation of the doped regions the method employs wafer scale bonding of the second wafer and the wafer to bond the dielectric stack to the semiconductor formation. (C12) The method of any of C1 through C11, wherein the method includes fabricating the semiconductor formation using a first wafer, separately fabricating a dielectric stack using a second wafer, the dielectric stack integrating one or more metallization layer defining readout circuitry for readout of signals from the array of doped areas; and wafer scale bonding the first wafer to the second wafer to integrally bond the dielectric stack to the semiconductor formation. (C13) The method of any of C1 through C12, wherein the method comprises fabricating vertically extending deep trench isolation (DTI) formations in the semiconductor formation that extend vertically between respective ones of the doped areas of the array of doped areas, and wherein the forming in the semiconductor formation an array of doped regions comprises forming respective ones of the doped regions so that respective ones of doped regions defining the array of doped regions laterally contact adjacent ones of the DTI formations. (C14) The method of any of C1 through C2, wherein the method comprises fabricating above the semiconductor formation, using backside processing, one or more filter between the semiconductor formation and the array of doped areas, the one or more filter blocking illumination of the excitation light and permitting light of the emission light to reach the array of doped areas. (C15) The method of any of C1 through C2, wherein the method comprises etching, from a frontside to a backside of the semiconductor formation, a plurality of trenches, and filling the plurality of trenches with dielectric material to define vertically extending deep trench isolation (DTI) formations in the semiconductor formation that extend vertically between respective ones of the doped areas of the array of doped areas. (C16) The method of any of C1 through C2, wherein the method comprises etching, from a backside to a frontside of the semiconductor formation, a plurality of trenches, and filling the plurality of trenches with dielectric material to define vertically extending deep trench isolation (DTI) formations in the semiconductor formation that extend vertically between respective ones of the doped areas of the array of doped areas. (C17) The method of any of C1 through C2, wherein the method comprises fabricating vertically extending deep trench isolation (DTI) formations in the semiconductor formation that extend vertically between respective ones of the doped areas of the array of doped areas, and wherein the forming in the semiconductor formation an array of doped regions comprises forming respective ones of the doped regions so that respective ones of the doped regions laterally contact first and second of the DTI formations. (C18) The method of any of C1 through C2, wherein the forming in the semiconductor formation an array of doped regions comprises forming a laterally extended doped region that laterally extends to oppose a plurality of doped areas of the array of doped areas such that respective central axes of doped regions defining the array of doped regions commonly extend through the laterally extended doped region, etching the laterally extended doped region to define trenches, and filling the trenches with dielectric material to define DTI formations that separate the laterally extended doped region into respective ones of the doped regions defining the array of doped regions. (C19) The method of any of C1 through C2, wherein the method includes depositing a dielectric stack on the semiconductor formation, the dielectric stack integrating a metallization layer defining circuitry for readout of signals from the array of doped areas. (C20) The method of any of C1 through C2, wherein the method includes depositing a dielectric stack on the semiconductor formation, the dielectric stack integrating a metallization layer defining circuitry for readout of signals from the array of doped areas, wherein for expansion of a thermal budget associated to a formation of the doped regions the method employs wafer flipping to facilitate the formation of the doped regions prior to the depositing of the dielectric stack. (C21) The method of any of C1 through C2, wherein the method includes depositing a dielectric stack on a second wafer separate from a wafer defining the semiconductor formation, the dielectric stack integrating a metallization layer defining circuitry for readout of signals from the array of doped areas, wherein for expansion of a thermal budget associated to a formation of the doped regions the method employs wafer scale bonding of the second wafer and the wafer to bond the dielectric stack to the semiconductor formation. (C22) The method of any of C1 through C2, wherein the method includes fabricating the semiconductor formation using a first wafer, separately fabricating a dielectric stack using a second wafer, the dielectric stack integrating one or more metallization layer defining readout circuitry for readout of signals from the array of doped areas; and wafer scale bonding the first wafer to the second wafer to integrally bond the dielectric stack to the semiconductor formation. (C23) The method of any of C1 through C2, wherein the method comprises fabricating vertically extending deep trench isolation (DTI) formations in the semiconductor formation that extend vertically between respective ones of the doped areas of the array of doped areas, and wherein the forming in the semiconductor formation an array of doped regions comprises forming respective ones of the doped regions so that respective ones of doped regions defining the array of doped regions laterally contact adjacent ones of the DTI formations. (D1) A device comprising: a support structure defining a detector surface configured for supporting biological or chemical samples; a plurality of spaced apart doped areas formed in a semiconductor formation, wherein the semiconductor formation receives excitation light and emission light from the detector surface, the plurality of spaced apart doped areas defining photodiodes; a plurality of spaced apart doped regions formed in the semiconductor formation, wherein respective ones of the plurality of spaced apart doped regions are associated to respective ones of the doped areas, and wherein the respective ones of the doped regions are disposed in a receive light path of the excitation light and emission light intermediate the detector surface and the respective ones of the doped areas; and wherein respective doped regions of the plurality of spaced apart doped regions formed in the semiconductor formation produce respective electric fields that impact a travel direction of electrons generated in the respective doped regions as a result of photons of the excitation light and emission light being absorbed in the respective doped regions. (D2) The device of D1, wherein the respective doped regions have a junction depth greater than an absorption depth of a center wavelength of the excitation light. (D3) The device of any of D1 through D2, wherein the respective doped regions have a junction depth less than an absorption depth of a center wavelength of the emission light. (D4) The device of any of D1 through D3, wherein the respective doped regions have a junction depth greater than an absorption depth of a center wavelength of the excitation light, and wherein the respective doped regions have a junction depth less than an absorption depth of a center wavelength of the emission light. (D5) The device of any of D1 through D4, wherein a junction depth of respective junctions defined by the respective doped regions is configured so that a percentage of photons at a center wavelength of the emission light absorbed at elevations of the semiconductor formation below the respective junctions is about $2\times$ or more than a percentage of photons at a center wavelength of the excitation light absorbed at elevations of the semiconductor formation below the respective junctions. (D6) The device of any of D1 through D4, wherein a junction depth of respective junctions defined by the respective doped regions is configured so that a percentage of photons at a center wavelength of the emission light absorbed at elevations of the semiconductor formation below the respective junctions is about $20\times$ or more than a percentage of photons at a center wavelength of the excitation light absorbed at elevations of the semiconductor formation below the respective junctions. (D7) The device of any of D1 through D4, wherein a junction depth of respective junctions defined by the respective doped regions is configured so that a percentage of photons at a center wavelength of the emission light absorbed at elevations of the semiconductor formation below the respective junctions is about $50\times$ or more than a percentage of photons at a center wavelength of the excitation light absorbed at elevations of the semiconductor formation below the respective junctions. (D8) The device of any of D1 through D7, wherein the respective doped regions are configured to cause drift of the electrons generated in the respective doped regions as a result of photons of the excitation light and emission light being absorbed in the respective doped regions. (D9) The device of any of D1 through D8, wherein the respective doped regions are configured to cause drift of the electrons generated in the respective doped regions as a result of photons of the excitation light and emission light being absorbed in the respective doped regions in a direction toward a light entry surface of the semiconductor formation. (D10) The device of any of D1 through D9, wherein the respective doped regions are dimensioned to feature a junction depth longer than an absorption depth of light in the blue wavelength band, the depth being shorter than an absorption depth of light in the red wavelength band. (D11) The device of any of D1 through D10, wherein the respective doped regions are dimensioned to feature a junction depth longer than an absorption depth of light in the green wavelength band, the depth being shorter than an absorption depth of light in the red wavelength band. (D12) The device of any of D1 through D11, wherein the respective doped regions are dimensioned so that an absorption depth of photons of the excitation light of a first wavelength is less than a junction depth of the respective doped regions. (D13) The device of any of D1 through D12, wherein the respective doped regions comprise a first set of respective doped regions having a first junction depth, and a second set of respective doped regions having a second junction depth, the second junction depth junction depth being less than the first junction depth. (D14) The device of any of D1 through D13, wherein the respective doped regions comprise a first set of respective doped regions having a first junction depth and being configured for wavelength separation of light in the green wavelength band, and a second set of respective doped regions having a second junction depth, the second junction depth being less than the first junction depth and being configured for wavelength separation of light in the blue wavelength band. (D15) The device of any of D1 through D14, wherein the semiconductor formation comprises vertically extending deep trench isolation formations separating the respective doped regions, wherein a doped region of the plurality of spaced apart doped regions laterally contacts first and second ones of the vertically extending deep trench isolation formations. (E1) A device comprising: a support structure defining a detector surface configured for supporting biological or chemical samples; an array of doped areas formed in a semiconductor formation, wherein the semiconductor formation receives excitation light and emission light from the detector surface, and wherein doped areas of the array of doped areas define photodiodes; a doped region formed in the semiconductor formation in a receive light path of the excitation light and emission light intermediate the detector surface and a doped area of the array of doped areas; and wherein the doped region is configured to impact a travel direction of electrons generated in the doped region as a result of photon absorption. (E2) The device of E1, comprising an array of doped regions formed in the semiconductor formation, wherein the array of doped regions comprises the doped region, and wherein respective ones of doped regions defining the array of doped regions are respectively associated to one doped area of the array of doped areas. (E3) The device of E1, comprising an array of doped regions formed in the semiconductor formation, wherein the array of doped regions comprises the doped region, and wherein respective ones of doped regions defining the array of doped regions are respectively associated to one doped area of the array of doped areas, and wherein the respective ones of doped regions defining the array of doped regions are respectively disposed in the receive light path of the excitation light and emission light intermediate the detector surface and one doped area of the array of doped areas. (E4) The device of any of E1 through E3, wherein the doped region produces an electric field that impacts a travel direction of electrons generated in the associated doped region as a result of photon absorption. (E5) The device of any of E1 through E4, wherein the doped region is configured to cause drift of the electrons generated in the doped region as a result of photons of the excitation light and emission light being absorbed in the doped region. (E6) The device of any of E1 through E5, wherein the doped region is configured to cause drift of the electrons generated in the doped region as a result of photons of the excitation light and emission light being absorbed in the respective doped region in a direction toward the light entry surface of the semiconductor formation. (E7) The device of any of E1 through E6, wherein the doped region has a junction depth longer than an absorption depth of the longest wavelength in the blue wavelength band, the depth being shorter than an absorption depth of the longest wavelength in the red wavelength band. (E8) The device of any of E1 through E7, wherein the doped region is dimensioned to feature a depth longer than an absorption depth of the longest wavelength in the green wavelength band, the depth being shorter than an absorption depth of the longest wavelength in the red wavelength band. (E9) The device of any of E1 through E8, wherein the doped region has a junction depth less than an absorption depth of a center wavelength of the emission light. (E10) The device of any of E1 through E9, wherein the doped region has a junction depth greater than an absorption depth of a center wavelength of the excitation light, and wherein the doped region is configured to have a junction depth less than an absorption depth of a center wavelength of the emission light. (E11) The device of any of E1 through E10, wherein a junction depth of the doped region is configured so that a percentage of photons at a center wavelength of the emission light absorbed at elevations of the semiconductor formation below the junction is about 2× or more than a percentage of photons at a center wavelength of the excitation light absorbed at elevations of the semiconductor formation below the junction. (E12) The device of any of E1 through E10, wherein a junction depth of the doped region is configured so that a percentage of photons at a center wavelength of the emission light absorbed at elevations of the semiconductor formation below the junction is about 20× or more than a percentage of photons at a center wavelength of the excitation light absorbed at elevations of the semiconductor formation below the junction. (E13) The device of any of E1 through E10, wherein a junction depth of the doped region is configured so that a percentage of photons at a center wavelength of the emission light absorbed at elevations of the semiconductor formation below the junction is about 50× or more than a percentage of photons at a center wavelength of the excitation light absorbed at elevations of the semiconductor formation below the junction. (F1) A method comprising: forming in a semiconductor formation an array of doped areas; forming in the semiconductor formation an array of doped regions, wherein respective doped regions of the array of doped regions are associated to respective doped areas of the array of doped areas; and providing a detector surface, wherein the semiconductor formation is configured to receive excitation light and emission light from the detector surface; wherein the respective doped regions are formed in the semiconductor formation in a receive light path of the excitation light and emission light from the detector surface. (F2) The method of F1, wherein the respective doped regions are configured to impact a travel direction of electrons generated therein as a result of photon absorption. (F3) The method of any of F1 through F2, wherein the method comprises fabricating above the semiconductor formation, using frontside processing, one or more filter between the semiconductor formation and the array of doped areas, the one or more filter blocking illumination of the excitation light and permitting light of the excitation light to reach the array of doped areas. (F4) The method of any of F1 through F3, wherein the method comprises fabricating above the semiconductor formation, using backside processing, one or more filter between the semiconductor formation and the array of doped areas, the one or more filter blocking illumination of the excitation light and permitting light of the excitation light to reach the array of doped areas. (F5) The method of any of F1 through F4, wherein the method comprises etching, from a frontside to a backside of the semiconductor formation, a plurality of trenches, and filling the plurality of trenches with dielectric material to define vertically extending deep trench isolation (DTI) formations in the semiconductor formation that extend vertically between respective ones of the doped areas of the array of doped areas. (F6) The method of any of F1 through F5, wherein the method comprises etching, from a backside to a frontside of the semiconductor formation, a plurality of trenches, and filling the plurality of trenches with dielectric material to define vertically extending deep trench isolation (DTI) formations in the semiconductor formation that extend vertically between respective ones of the doped areas of the array of doped areas. (F7) The method of any of F1 through F6, wherein the method comprises fabricating vertically extending deep trench isolation (DTI) formations in the semiconductor formation that extend vertically between respective ones of the doped areas of the array of doped areas, and wherein the forming in the semiconductor formation an array of doped regions comprises forming respective ones of the doped regions so that respective ones of the doped regions laterally contact first and second of the DTI formations. (F8) The method of any of F1 through F7, wherein the forming in the semiconductor formation an array of doped regions comprises forming an extended doped region that extends to oppose a plurality of doped areas of the array of doped areas, etching the extended doped region to defining trenches, and filling the trenches with dielectric material to define DTI formations that separate the extended doped region into respective ones of the doped regions defining the array of doped regions.

The terms "substantially", "approximately", "about", "relatively", or other such similar terms that may be used throughout this disclosure, including the claims, are used to describe and account for small fluctuations, such as due to variations in processing, from a reference or parameter. Such small fluctuations include a zero fluctuation from the reference or parameter as well. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. If used herein, the terms "substantially", "approximately", "about", "relatively," or other such similar terms may also refer to no fluctuations, that is, ±0%.

It is contemplated that numerical values, as well as other values that are recited herein are modified by the term "about", whether expressly stated or inherently derived by the discussion of the present disclosure. As used herein, the term "about" defines the numerical boundaries of the modified values so as to include, but not be limited to, tolerances and values up to, and including the numerical value so modified. That is, numerical values can include the actual value that is expressly stated, as well as other values that are, or can be, the decimal, fractional, or other multiple of the actual value indicated, and/or described in the disclosure.

It should be appreciated that all combinations of the foregoing concepts and additional concepts discussed in greater detail below (provided such concepts are not mutually inconsistent) are contemplated as being part of the subject matter disclosed herein. In particular, all combinations of claims subject matter appearing at the end of this disclosure are contemplated as being part of the subject matter disclosed herein. It should also be appreciated that terminology explicitly employed herein that also may appear in any disclosure incorporated by reference should be accorded a meaning most consistent with the particular concepts disclosed herein.

This written description uses examples to disclose the subject matter, and also to enable any person skilled in the art to practice the subject matter, including making and using any devices or systems and performing any incorporated methods. The patentable scope of the subject matter is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the above description is intended to be illustrative, and not restrictive. For example, the above-described examples (and/or aspects thereof) can be used in combination with each other. In addition, many modifications can be made to adapt a particular situation or material to the teachings of the various examples without departing from their scope. While the dimensions and types of materials described herein are intended to define the parameters of the various examples, they are by no means limiting and are merely exemplary. Many other examples will be apparent to those of skill in the art upon reviewing the above description. The scope of the various examples should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Forms of the term "based on" herein encompass relationships where an element is partially based on as well as relationships where an element is entirely based on. Forms of the term "defined" encompass relationships where an element is partially defined as well as relationships where an element is entirely defined. Further, the limitations of the following claims are not written in means-plus-function format and are not intended to be interpreted based on 35 U.S.C. § 112 (f) unless and until such claim limitations expressly use the phrase "means for" followed by a statement of function void of further structure. It is to be understood that not necessarily all such objects or advantages described above can be achieved in accordance with any particular example. Thus, for example, those skilled in the art will recognize that the systems and techniques described herein can be embodied or carried out in a manner that achieves or optimizes one advantage or group of advantages as taught herein without necessarily achieving other objects or advantages as can be taught or suggested herein.

While the subject matter has been described in detail in connection with only a limited number of examples, it should be readily understood that the subject matter is not limited to such disclosed examples. Rather, the subject matter can be modified to incorporate any number of variations, alterations, substitutions or equivalent arrangements not heretofore described, but which are commensurate with the spirit and scope of the subject matter. Additionally, while various examples of the subject matter have been described, it is to be understood that aspects of the disclosure can include only some of the described examples. Also, while some examples are described as having a certain number of elements it will be understood that the subject matter can be practiced with less than or greater than the certain number of elements. In addition, it will be understood that any feature herein described with respect to a certain example, can be incorporated into another example. Further, any description of a range herein encompasses all subranges. Accordingly, the subject matter is not to be seen as limited by the foregoing description, but is only limited by the scope of the appended claims.

The invention claimed is:

1. A device comprising:
a detector surface comprising reaction sites for supporting biological or chemical samples;
a plurality of spaced apart doped areas formed in a semiconductor formation, wherein the semiconductor formation receives excitation light and emission light from the detector surface, the plurality of spaced apart doped areas defining photodiodes;
a plurality of spaced apart doped regions formed in the semiconductor formation, wherein respective ones of the plurality of spaced apart doped regions are associated to respective ones of the doped areas, and wherein the respective ones of the doped regions are disposed in a receive light path of the excitation light and emission light intermediate the detector surface and the respective ones of the doped areas; and
wherein respective doped regions of the plurality of spaced apart doped regions formed in the semiconductor formation produce respective electric fields that impact a travel direction of electrons generated in the respective doped regions as a result of photons of the excitation light being absorbed in the respective doped regions, wherein the respective doped regions have a junction depth greater than an absorption depth of a center wavelength of the excitation light, wherein the junction depth of the respective doped regions is less than an absorption depth of a center wavelength of the emission light, wherein junctions of the respective doped regions are spaced apart from the respective associated doped areas, and wherein junctions of the respective associated doped areas are spaced apart from the respective doped regions.

2. The device of claim 1, wherein a junction depth of respective junctions defined by the respective doped regions is configured so that a percentage of photons at a center wavelength of the emission light absorbed at elevations of the semiconductor formation below the respective junctions is about 2× or more than a percentage of photons at a center wavelength of the excitation light absorbed at elevations of the semiconductor formation below the respective junctions.

3. The device of claim 1, wherein the respective doped regions are configured to cause drift of the electrons generated in the respective doped regions as a result of photons of the excitation light and emission light being absorbed in the respective doped regions in a direction toward a light entry surface of the semiconductor formation.

4. The device of claim 1, wherein the respective doped regions are dimensioned to feature a junction depth longer than an absorption depth of light in the blue wavelength band, the depth being shorter than an absorption depth of light in the red wavelength band.

5. The device of claim 1, wherein the respective doped regions comprise a first set of respective doped regions having a first junction depth, and a second set of respective doped regions having a second junction depth, the second junction depth being less than the first junction depth.

6. The device of claim 1, wherein the respective doped regions comprise a first set of respective doped regions having a first junction depth and being configured for wavelength separation of light in the green wavelength band, and a second set of respective doped regions having a second junction depth, the second junction depth being less than the first junction depth and being configured for wavelength separation of light in the blue wavelength band.

7. The device of claim 1, wherein the semiconductor formation comprises vertically extending deep trench isolation formations separating the respective doped regions, wherein a doped region of the plurality of spaced apart doped regions laterally contacts first and second ones of the vertically extending deep trench isolation formations.

8. The device of claim 1, wherein the respective doped regions define a light entry surface of the semiconductor formation, wherein the respective doped regions have a junction depth greater than an absorption depth of a center wavelength of the excitation light, and wherein the junction depth of the respective doped regions is less than an absorption depth of a center wavelength of the emission light, wherein the plurality of spaced apart doped areas and the plurality of spaced apart doped regions are separated by a vertical spacing distance, wherein the plurality of spaced apart doped areas have a common top elevation and the plurality of spaced apart doped regions have a common bottom elevation, and wherein the semiconductor formation is undoped between the common top elevation of the plurality of spaced apart doped areas and the common bottom elevation of the plurality of spaced apart doped regions, wherein respective ones of the plurality of spaced apart doped regions are aligned to respective ones of the doped areas, and wherein alignment of respective ones of the plurality of spaced apart doped regions to respective ones of the doped areas is characterized by vertically extending central axes of respective ones of the doped areas extending through respective ones of the doped regions, wherein respective ones of the reaction sites of the detector surface are associated to respective ones of the plurality of spaced apart doped areas, wherein the device includes a light energy exciter for illuminating sites of the reactions sites, wherein the device is controlled so that the light energy exciter directs excitation light toward a plurality of adjacent ones of the reaction sites simultaneously for simultaneous excitation of samples supported respectively by the plurality of adjacent ones of the reaction sites.

9. The device of claim 8, wherein the semiconductor formation on which the plurality of spaced apart doped areas and the plurality of spaced apart doped regions are formed includes a p-substrate or n-substrate.

10. The device of claim 1, wherein the semiconductor formation intermediate the respective doped regions and the respective associated doped areas forms junction interfaces with the respective doped areas.

11. The device of claim 1, wherein a bottom elevation of the respective doped regions defined by the junctions of the respective doped regions is spaced apart from a top elevation of the respective doped areas defined by the junctions of the respective doped areas.

12. The device of claim 1, wherein a bottom elevation of the respective doped regions defined by the junctions of the respective doped regions is spaced apart from a top elevation of the respective doped areas defined by the junctions of the respective doped areas, and wherein the respective doped regions are provided as n-doped regions on a p-substrate.

13. A device comprising:

a detector surface for supporting biological or chemical samples;

an array of doped areas formed in a semiconductor formation, wherein the semiconductor formation receives excitation light and emission light from the detector surface, and wherein doped areas of the array of doped areas define photodiodes;

a doped region formed in the semiconductor formation in a receive light path of the excitation light and emission light intermediate the detector surface and a doped area of the array of doped areas;

an array of doped regions formed in the semiconductor formation, wherein the array of doped regions comprises the doped region, and wherein respective ones of doped regions defining the array of doped regions are respectively associated to one doped area of the array of doped areas; and wherein the doped region is configured to impact a travel direction of electrons generated in the doped region as a result of photon absorption, and wherein junctions of the respective doped regions are spaced apart from the respective associated doped areas.

14. The device of claim 13, wherein the respective ones of doped regions defining the array of doped regions are respectively disposed in the receive light path of the excitation light and emission light intermediate the detector surface and one doped area of the array of doped areas.

15. The device of claim 13, wherein the doped region produces an electric field that impacts a travel direction of electrons generated in the doped region as a result of photon absorption.

16. The device of claim 13, wherein the doped region is configured to cause drift of the electrons generated in the doped region as a result of photons of the excitation light being absorbed in the doped region.

17. The device of claim 13, wherein a bottom elevation of the respective doped regions defined by the junctions of the respective doped regions is spaced apart from a top elevation of the respective doped areas defined by junctions of the respective doped areas.

18. The device of claim 13, wherein a bottom elevation of the respective doped regions defined by the junctions of the respective doped regions is spaced apart from a top elevation of the respective doped areas defined by junctions of the respective doped areas, and wherein the respective doped regions are provided as n-doped regions on a p-substrate.

19. A device comprising:

a detector surface comprising reaction sites for supporting biological or chemical samples;

a plurality of spaced apart doped areas formed in a semiconductor formation, wherein the semiconductor formation receives excitation light and emission light from the detector surface, the plurality of spaced apart doped areas defining photodiodes;

a plurality of spaced apart doped regions formed in the semiconductor formation, wherein respective ones of the plurality of spaced apart doped regions are associated to respective ones of the doped areas, and wherein the respective ones of the doped regions are disposed in a receive light path of the excitation light and emission light intermediate the detector surface and the respective ones of the doped areas; and wherein respective doped regions of the plurality of spaced apart doped regions formed in the semiconductor formation produce respective electric fields that impact a travel direction of electrons generated in the respective doped regions as a result of photons of the excitation light being absorbed in the respective doped regions, and wherein the semiconductor formation intermediate the respective doped regions and the respective associated doped areas forms junction interfaces with the respective doped areas.

* * * * *